United States Patent
Swirhun et al.

(10) Patent No.: US 7,053,415 B2
(45) Date of Patent: *May 30, 2006

(54) CLOSELY-SPACED VCSEL AND PHOTODETECTOR FOR APPLICATION REQUIRING THEIR INDEPENDENT OPERATION

(75) Inventors: Stanley E. Swirhun, Boulder, CO (US); Jeffrey W. Scott, Boulder, CO (US)

(73) Assignee: Optical Communication Products, Inc., Woodland Hills, CA (US)

( * ) Notice: Subject to any disclaimer, the term of this patent is extended or adjusted under 35 U.S.C. 154(b) by 58 days.

This patent is subject to a terminal disclaimer.

(21) Appl. No.: 10/455,005

(22) Filed: Jun. 4, 2003

(65) Prior Publication Data
US 2003/0228716 A1 Dec. 11, 2003

Related U.S. Application Data

(60) Continuation of application No. 10/038,230, filed on Jan. 3, 2002, now abandoned, which is a division of application No. 09/348,353, filed on Jul. 7, 1999, now Pat. No. 6,392,256, which is a continuation-in-part of application No. 08/803,891, filed on Feb. 21, 1997, now Pat. No. 6,001,664, which is a continuation of application No. 08/593,117, filed on Feb. 1, 1996, now abandoned.

(51) Int. Cl.
*H01L 27/15* (2006.01)
(52) U.S. Cl. .......................... 257/82; 257/79; 257/80; 257/83; 257/85; 257/99; 257/233; 257/432
(58) Field of Classification Search ............ 257/79–85, 257/94, 99, 233, 292, 432
See application file for complete search history.

(56) References Cited

U.S. PATENT DOCUMENTS

| | | | | | |
|---|---|---|---|---|---|
| 4,124,860 | A | * | 11/1978 | Johnson ........................ | 257/82 |
| 5,136,603 | A | * | 8/1992 | Hasnain et al. ................ | 372/50 |
| 5,404,373 | A | * | 4/1995 | Cheng .......................... | 372/50 |
| 5,434,434 | A | * | 7/1995 | Kasahara et al. ............. | 257/84 |
| 5,526,160 | A | * | 6/1996 | Watanabe et al. ........... | 398/138 |
| 5,576,829 | A | * | 11/1996 | Shiraishi et al. ............. | 356/521 |
| 6,001,664 | A | * | 12/1999 | Swirhun et al. .............. | 438/31 |

* cited by examiner

*Primary Examiner*—Wael Fahmy
*Assistant Examiner*—Wai-Sing Louie
(74) *Attorney, Agent, or Firm*—Barlow, Josephs & Holmes, Ltd.

(57) ABSTRACT

A monolithically integrated VCSEL and photodetector, and a method of manufacturing the same, are disclosed for applications where the VCSEL and photodetector require separate operation such as duplex serial data communications applications. A first embodiment integrates a VCSEL with an MSM photodetector on a semi-insulating substrate. A second embodiment builds layers of a p-i-n photodiode on top of layers forming a VCSEL using a standard VCSEL process. The p-i-n layers are etched away in areas where VCSELs are to be formed and left where photodetectors are to be formed. The VCSELs underlying the photodetectors are inoperable, and serve to recirculate photons which are not initially absorbed back into the photodetector. The transmit and receive pairs are packaged into a single package for interface to multifiber ferrules. The distance between the devices is precisely defined photolithographically, thereby making alignment easier. In a further alternate embodiment, a FET is coupled to the p-i-n photodiode to form an integrated detector preamplifier along with the VCSEL transmitter all on the same optical reference plane.

6 Claims, 20 Drawing Sheets

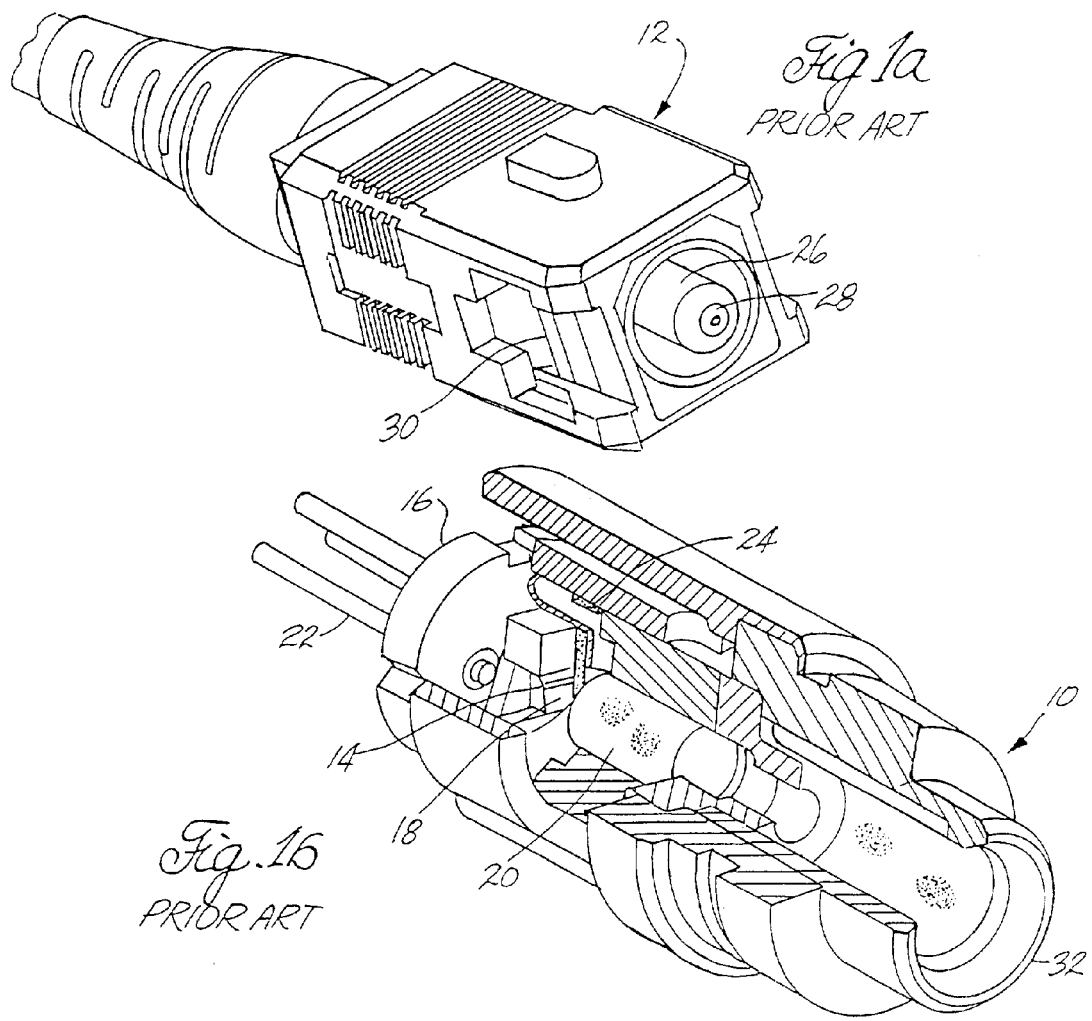

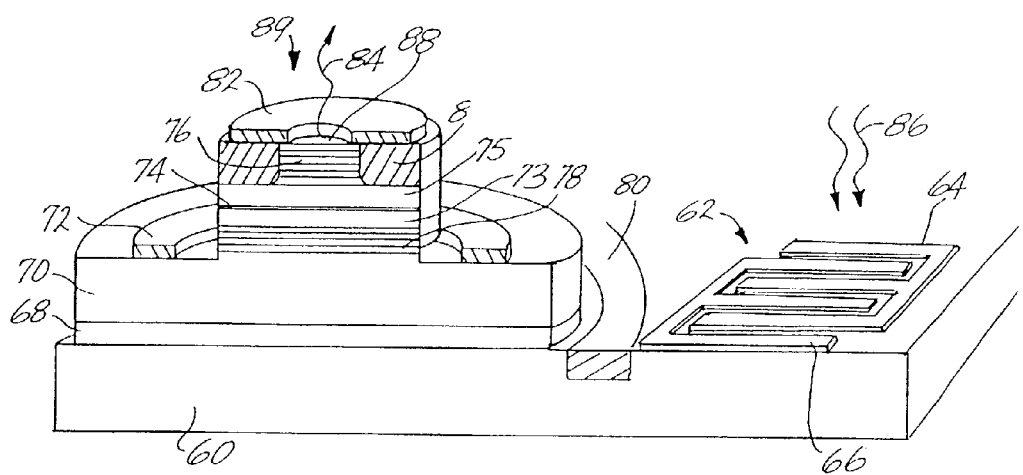
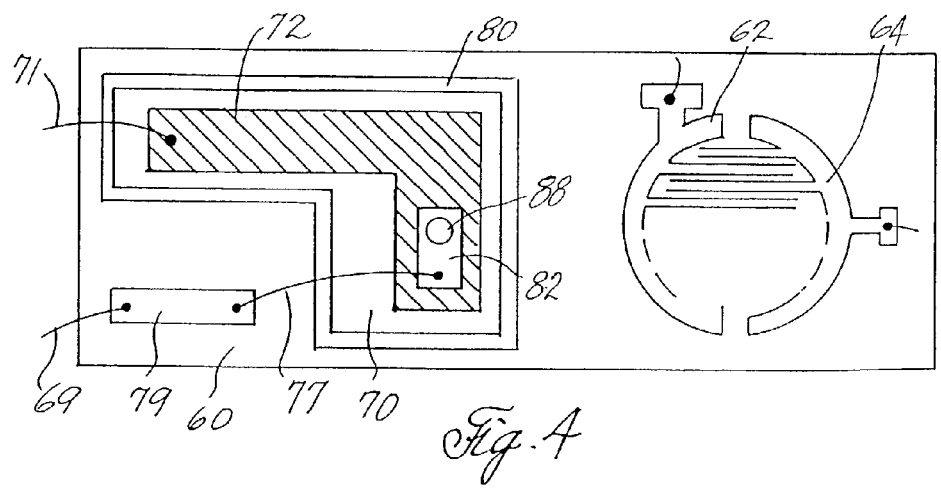

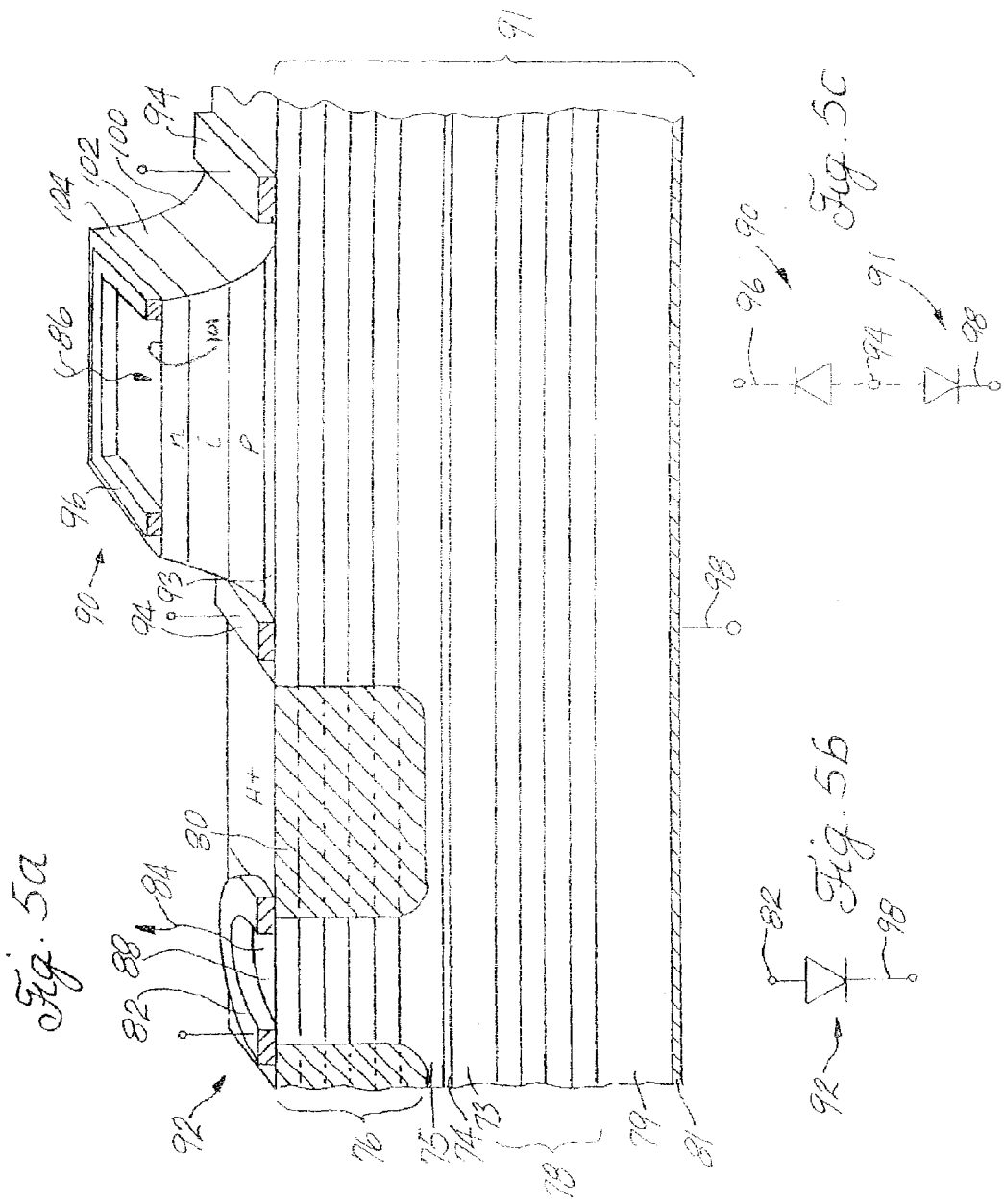

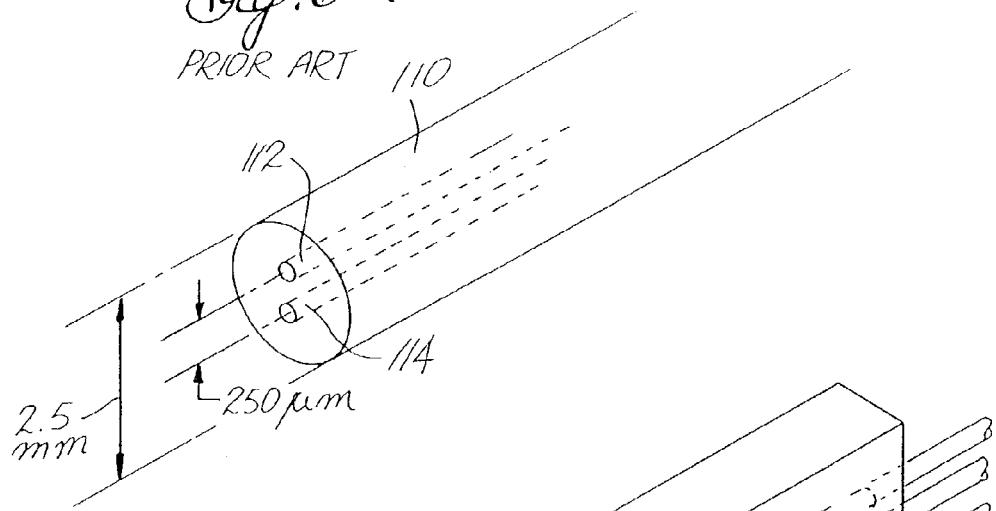
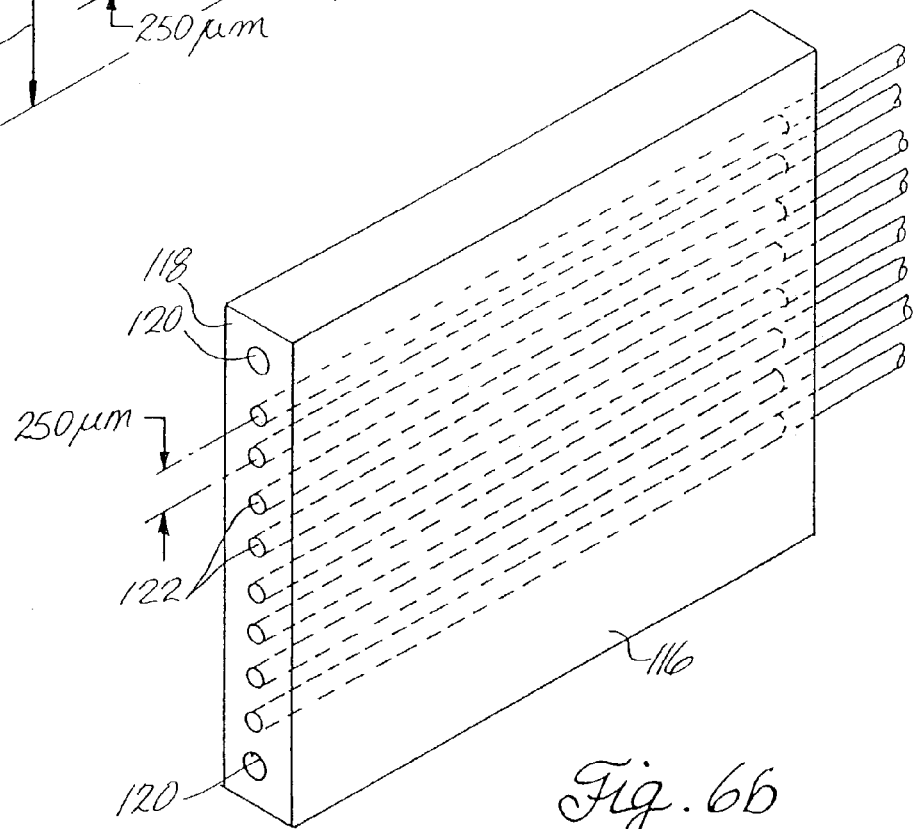

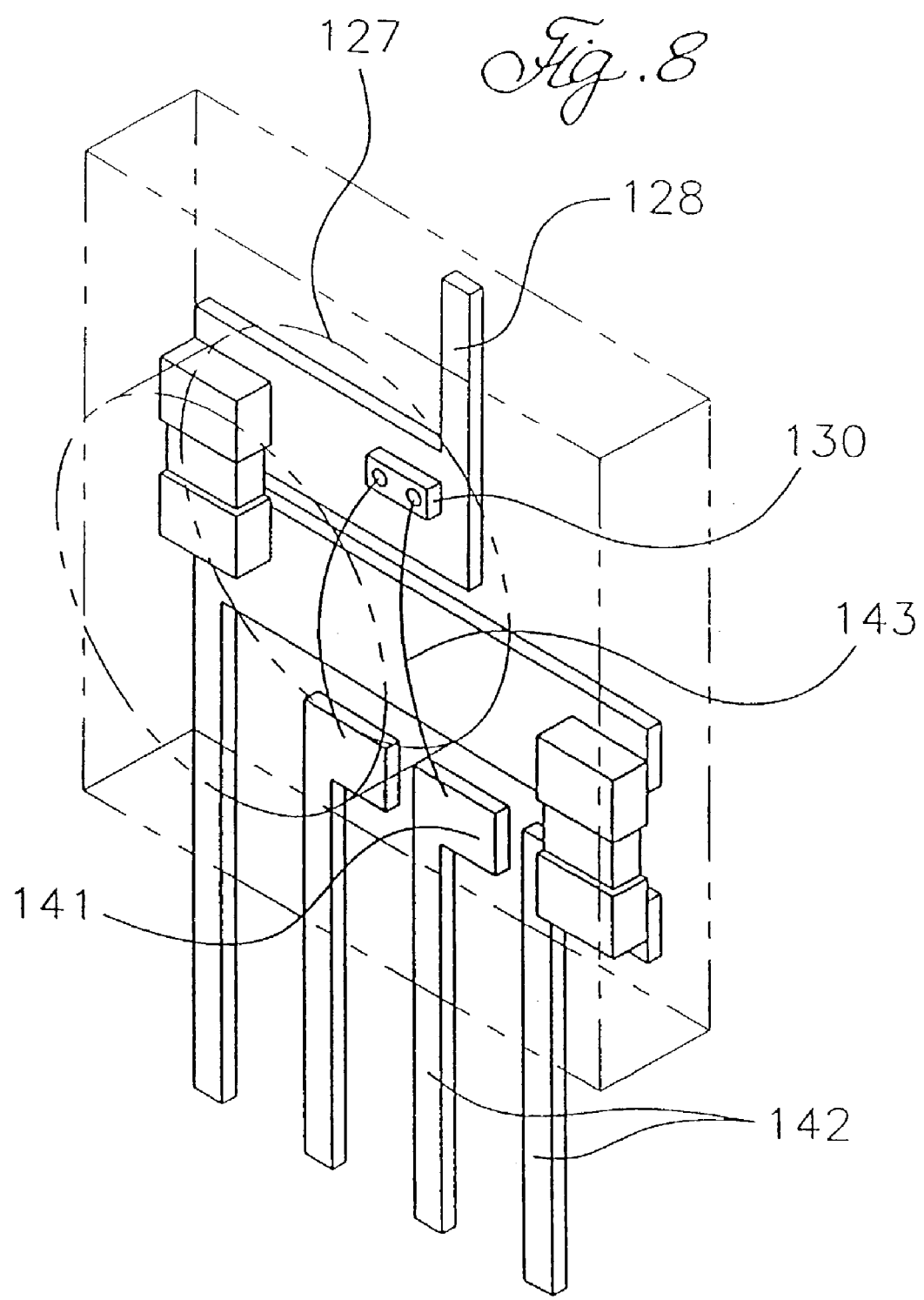

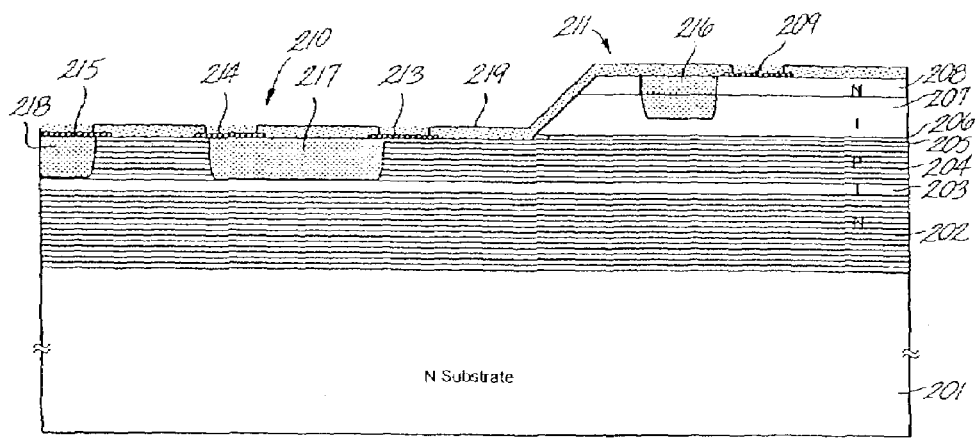
Fig. 14a
Fig. 14b
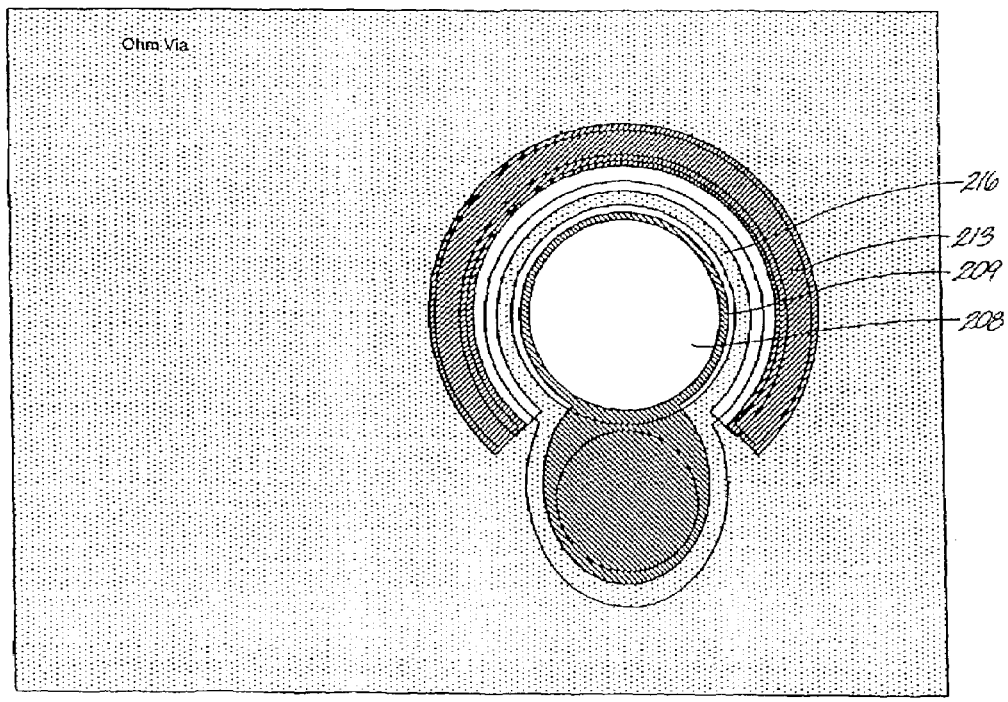

CLOSELY-SPACED VCSEL AND PHOTODETECTOR FOR APPLICATION REQUIRING THEIR INDEPENDENT OPERATION

CROSS-REFERENCE TO RELATED APPLICATIONS

This application is a continuation of U.S. patent application Ser. No. 10/038,230, filed Jan. 3, 2002 now abandoned, which is a divisional of U.S. patent application Ser. No. 09/348,353 filed Jul. 7, 1999, now U.S. Pat. No. 6,392,256, which is a continuation-in part of U.S. patent application Ser. No. 08/803,891 filed Feb. 21, 1997, now U.S. Pat. No. 6,001,664, which is a continuation of U.S. patent application Ser. No. 08/593,117 filed Feb. 1, 1996, now abandoned, the contents of which are hereby incorporated by reference.

FIELD OF THE INVENTION

The present invention relates to vertical cavity surface emitting lasers (VCSELs) and photodetectors, and more particularly to the application of such optoelectronic devices where they must operate independently but where it is also desirable to have a transmitter and a receiver closely-spaced.

BACKGROUND OF THE INVENTION

There are a number of data communications applications that make use of optoelectronic sending and receiving devices (i.e. light emitters and photodetectors). For fiber optic data communication applications requiring less than 200 MBits/sec., light emitting diodes (LEDs) are the light emitters of choice because they are relatively inexpensive to manufacture. For applications requiring higher speeds, lasers are typically used as the light emitters.

Until recently, most high speed data communications applications employed edge emitting lasers in a serial (single channel) format. With the advent of Vertical Cavity Surface Emitting Lasers (VCSELs), many such applications are now implemented using VCSEL arrays that can be interfaced to ferrules carrying multiple fibers to transmit several bits of data in parallel. At the receiving end, an array of photodetectors is coupled to the multiple fibers. The ability to manufacture VCSELs in arrays (an advantage of LEDs), combined with their high speed of operation (an advantage of lasers), makes VCSELs desirable in such applications.

For high-speed serial duplex data communications applications, however, separately packaged light emitters (usually edge emitting lasers) and photodetectors are still employed. For long-haul applications (typically having distances greater than 1 kilometer), wavelength division multiplexing is often employed to transmit and receive data for a duplex channel over the same fiber. Because the primary cost of a long-haul duplex serial data channel resides in the fiber and its installation, complex beam-splitting techniques can be justified at the ends of the channel to separate the transmit and receive data streams from the single fiber.

For short-haul or "premises" applications, however, the cost of fiber and fiber installation is relatively less important than the cost of the many transmit and receive functions. Thus, it is the cost of the data transmit and receive components, and particularly the optoelectronic devices and their packaging, that drives cost considerations for short-haul applications. Typical short-haul implementations of a high-speed serial fiber optics data communications channel operating in full duplex still employ two multimode fibers, each one to connect an individually packaged transmitting light emitter to an individually packaged receiving photodetector. This is because the cost of complex beam-splitting components often cannot be justified.

FIGS. 1(a) and 1(b) illustrate the components comprising a typical implementation of a transmit or receive link for a short-haul high-speed duplex data communications application. FIG. 1(a) illustrates a fiber assembly 12. A round ferrule 26 houses an optical fiber 28, which is located precisely in the center of ferrule 26. A typical diameter for ferrule 26 is approximately 2.5 mm. Ferrule 26 comes with a latching mechanism 30, which is used to clamp and secure the ferrule to a barrel 32 of an optical sub-assembly 10, which is depicted in FIG. 1(b). Barrel 32 houses optoelectronic device 14 typically in a TO can package 16 centrally located in the barrel as shown. Optoelectronic device 14 is typically located at an appropriate point within can 16 by a standoff 2. Driver or amplifier circuitry is coupled to optoelectronic device 14 through leads 22. A window 18 is provided in the top of the can package to allow transmitted light out or received light in, depending upon whether the optoelectronic device is a light emitter or a photodetector. The TO package is aligned with fiber 28 and epoxied using epoxy 24 to fix the position of the optoelectronic device with respect to the ferrule 26 and hence fiber 28. Optical elements such as lens 20 are typically provided to focus the light for optimal optical efficiency, particularly where the light emitter is an edge emitting laser. Barrel 32 is designed to mate with latching mechanism 30 of fiber assembly 12.

Both fiber assembly 12 and barrel 10 are precision manufactured for precise mating. Active alignment TO package 16 and optoelectronic device is ordinarily performed in the x, y and z axes. First, the optoelectronic device is precisely aligned within the package 16. Second, the package 16 is precisely aligned within barrel 10. Finally, optical element 20 is precisely aligned with respect to its distance from the optoelectronic device 14 to achieve proper optical operation. Because a separate package is required for both the transmit side and the receive side of the duplex data channel, a total of twelve active alignments are typically performed for each channel and each channel includes the cost of eight precision-manufactured coupling parts.

FIGS. 1(c) and 1(d) provide schematic illustrations of the fiber assembly 12 and optoelectronics subassembly 10 of FIGS. 1(a) and 1(b), respectively.

FIG. 2 illustrates a typical duplex serial data communications module 40, which has mounted to it an optical subassembly 52 containing a light emitting device 13 disposed in a TO can package 9 having a window 17, which is to be mated with an optical fiber assembly 46 and which is dedicated to data transmission. Module 40 also has an optical subassembly 50 mounted to it containing a photodetector 15 disposed in TO can package 11 and which is to be mated with optical fiber assembly 48 and dedicated to receiving data from a remote module not shown. Because of the differing optical requirements of the transmit and receive devices, the modules must often be mounted in a staggered fashion as shown. Moreover, the transmit devices are located at an optically appropriate point in their can packages by standoffs 4 and 6 respectively.

Because of the cost of the precision components and the large number of alignments required for implementing duplex serial modules 40, it is highly desirable to integrate the transmit and receive optoelectronic devices (i.e. light emitter and photodetector) into one package. The integration of the two devices into a single package is not, however, an easily achieved solution. The prior art implementations as illustrated in FIGS. 1a–d and 2 cannot be readily adapted to multifiber ferrules currently available for unidirectional data transmission using VCSEL arrays. These multifiber ferrules have fiber spacings which are typically about 250 microns and can be less. The diameter of the TO can package 14 commonly used in present implementations is itself 5600 microns in diameter. Thus, the standard ferrule and barrel would have to grow substantially in diameter to accommodate two fibers having the spacing dictated by the TO cans housing the optoelectronic devices.

Even if a substantially larger barrel could be created to integrate the light emitter and photodetector as commonly packaged to receive both a transmit and a receive fiber, it is not clear that the resulting package could provide the necessary separation of incoming and scattered outgoing light beams to prevent crosstalk between the transmit and receive signals (at least not without complex optics and possibly some form of isolation). Although solutions have been disclosed to stack a light emitter (typically an LED) on top of a photodetector to transmit and receive wavelength division multiplexed signals (the light emitter is transparent to the received wavelength), beam-splitting must still be employed at the opposite end.

Closely spaced VCSELs and photodetectors can suffer leakage effects which can degrade the sensitivity of and induce excess noise into the operation of the photodetector. Also, current leakage from the VCSEL to the photodetector can unacceptably alter the operating characteristics of the photodetector over time.

Conventional photodetectors output low amplitude current signals that are highly susceptible to noise and crosstalk with the VCSEL. Therefore, conventional photodetectors require highly sensitive interface electronics, typically Gallium Arsenide (GaAs) for high speed, low noise integration with the photodetector. The use of GaAs receiver electronics, however, greatly adds to the cost of high speed data communications.

Thus, there is room in the art for an improvement in the area of optoelectronic device fabrication which facilitates the integration of one or more pairs of transmit and receive devices, without current leakage between them, for interfacing with a single ferrule carrying one or more pairs of fibers having spacings of 250 microns or less, to substantially reduce the cost and complexity of implementing high-speed serial duplex data communications channels including the cost of receiver interface electronics.

SUMMARY OF THE INVENTION

It is therefore an objective of the present invention to provide a VCSEL device sufficiently close to a photodetector device to permit the use of commercially available multifiber ferrules having fibers spaced on the order of 750 microns to 250 microns or less. Ferrules having fiber spacing of 750 microns are referred to as having a small form factor (SMFF).

The present invention provides closely-spaced but independently operable optoelectronic devices by monolithically integrating the two devices on the same substrate. The invention also provides a process by which multiple pairs of VCSELs and photodetectors can be arrayed on the same substrate. The invention further provides a process by which the closely-spaced but independently operable optoelectronic devices can be packaged using known lead-frame or ceramic packaging technologies. The invention may be used to integrate any requisite optics with either the semiconductor manufacturing technology or the packaging technology.

The invention simplifies significantly the alignment of the fibers to the closely-spaced optoelectronic devices by taking advantage of the photolithographic nature of monolithic semiconductor processing to precisely define the separation between the optoelectronic devices.

The invention also provides closely-spaced but independently operable VCSEL and photodetector pairs capable of near-field operation requiring no optics and which permit butt coupling between a package containing the optoelectronic devices and a flat faced multifiber ferrule.

In a first preferred embodiment of the invention, one or more VCSELs are formed using a known process for manufacturing such devices. The one or more VCSELs comprise an n-type GaAs substrate and a first mirror formed on the substrate, which is a well-known distributed Bragg reflector (DBR), and a first spacer or cladding layer which is formed on top of mirror. This first mirror is also preferably doped n-type. An active region is then formed on top of the first cladding layer, the active region comprising at least one quantum well layer or bulk layer. A second spacer or cladding layer is formed on the active region, with a second DBR being formed on the second spacer layer and doped to have p-type conductivity.

On top of the VCSEL layers is grown an etch-stop layer of AlGaAs having about 90% or greater Al content. An extended p-type layer of AlGaAs having more typical alloy proportions is then grown on top of the etch-stop layer. On top of this p-type layer is grown an intrinsic layer (i) which is undoped GaAs. On top of the intrinsic layer is grown an n-type region of AlGaAs. An etching process is then performed to etch away the extended p, i, and n layers where the one or more VCSELs are to be formed. The etching process uses the etch-stop layer to mark the end of the etching process so that the VCSEL area has exposed the top surface of an appropriately designed mirror. A proton implant region is created which separates the one or more VCSELs and the photodetectors formed by the unetched p, i, and n layers. Anode contacts are formed over the non-implanted p regions to form apertures for the VCSELs. A VCSEL cathode contact is formed on the substrate. Anode contacts are also formed on the p region of the p-i-n photodiode and a cathode contact is made to the n region of the p-i-n photodiode.

Thus, in this preferred embodiment, a VCSEL circuit can be isolated from a p-i-n photodiode using a proton implant isolation region which is commonly used to isolate VCSELs formed in arrays. The anode contacts to the p region of the p-i-n photodiode may be coupled to ground so that the VCSEL structure which lies underneath the p-i-n photodiode is never turned on and other bipolar parasitic effects are avoided. The width of the proton implant isolation region is typically between 50 and 100 microns. Thus, the VCSEL and the p-i-n photodiode can be separated by an accurately known distance, significantly less than 25 microns if desired. Moreover, the difference in thickness between the VCSEL and the p-i-n photodiode is small, thereby permitting near-field coupling of the optoelectronic devices to fibers.

One significant advantage of the first embodiment of the invention is that it requires very few additional steps to an otherwise typical VCSEL manufacturing process. A second advantage is that, when an anti-reflection coating of silicon nitride is applied to the photo-receiving n region of the photodiode, in conjunction with the p-type mirror which underlies the p-i-n photodiode, a high degree of efficiency is achieved. The silicon nitride anti-reflection coating increases transmission of incoming light into the surface of the p-i-n photodiode. Additionally, any light which is not absorbed by the intrinsic layer of the photodiode on its way through will be reflected from the underlying p-type mirror back into the intrinsic layer and will then have a second opportunity to be absorbed.

A second preferred embodiment of the invention employs a VCSEL with an MSM photodiode. The VCSEL is manufactured on a semi-insulating substrate. Because the MSM photodetector employs the semi-insulating layer as its common cathode, the two optoelectronic devices are virtually isolated from one another electronically as a result. A photolithographically defined minimum spacing of 250 microns or less can also be achieved using the second preferred embodiment of the invention. An anti-reflection coating is also preferably employed over the MSM photodetector to increase efficiency. To further enhance electrical isolation between the two devices, an isolation region can also be formed, preferably by implantation. Another advantage of using an MSM photodiode is that the two anode terminals can be used to drive a differential amplifier, thereby permitting common-mode rejection of noise.

Either of the two preferred embodiments can be integrated with optically transmissive materials that can be formed into lenses on the surface of the semiconductor. Either embodiment can also be implemented within standard precision manufactured barrels to be aligned with circular ferrules containing multiple fibers. Finally, either embodiment can be encapsulated using known lead-frame or ceramic packaging technology to permit near-field flat coupling between a flat package having an optically transmissive surface and a commercially available flat rectangular ferrule containing multiple fibers.

An alternative embodiment of the present invention provides a low cost method of repeatably manufacturing a closely-spaced or small form factor (SMFF) package for optical transceivers. The system includes a highly insulative, proton implantation region that isolates the photodetector and eliminates current leakage (i.e. crosstalk) between the VCSEL and photodetector. In an alternate embodiment of the present invention, the photodetector is integrated with a FET to form a high speed integrated detector preamplifier on a single chip.

In one aspect, the present inventions provides a method of manufacturing monolithic VCSEL and photodetector pairs by forming VCSEL layers directly on a semiconductor wafer substrate by forming first mirror layers, forming a first cladding layer on the first mirror layers, forming an active region on the first cladding layer, forming a second cladding layer on the active region, forming second mirror layers on the second cladding layer, forming photodiodes distributed across the wafer, and defining active and inactive VCSELs by forming isolation regions around the second mirror layers of the active VCSELs.

In another aspect, the present inventions provides method of manufacturing monolithic VCSEL and photodetector pairs by forming VCSEL layers directly on a semiconductor wafer substrate by forming first mirror layers, forming a first cladding layer on the first mirror layers, forming an active region on the first cladding layer, forming a second cladding layer on the active region, forming second mirror layers on the second cladding layer, forming photodiodes distributed across the wafer, and defining active and inactive VCSELs by forming proton implant isolation regions around the second mirror layers of the active VCSELs.

In a still further aspect, the present invention provides a method of manufacturing monolithic VCSEL and photodetector pairs by forming VCSEL layers directly on a semiconductor wafer substrate by forming first mirror layers, forming a first cladding layer on the first mirror layers, forming an active region on the first cladding layer, forming a second cladding layer on the active region, forming second mirror layers on the second cladding layer, forming photodiodes distributed across the wafer, and defining active and inactive VCSELs by forming proton implant isolation regions 50–100 microns wide around the second mirror layers and extending vertically through the second mirror layers to the second cladding layer.

In still another aspect, the present invention provides a method of manufacturing monolithic VCSEL and photodetector pairs by forming VCSEL layers directly on a semiconductor wafer substrate by forming first mirror layers, forming a first cladding layer on the first mirror layers, forming an action region on the first cladding layer, forming a second cladding layer on the active region, forming second mirror layers on the second cladding layer, forming photodiodes distributed across the wafer, and forming VCSEL anode contacts overlapping a topmost second mirror layer and the isolation region of the active VCSELs.

In still another aspect, the present invention provides a method of manufacturing monolithic VCSEL and photodetector pairs by forming VCSEL layers directly on a semiconductor wafer substrate, then forming photodiodes distributed across the wafer directly on the semiconductor wafer substrate at discrete locations.

In still another aspect, the present invention provides a method of manufacturing monolithic VCSEL and photodetector pairs by forming VCSEL layers directly on a semiconductor wafer substrate by forming first mirror layers, forming a first cladding layer on the first mirror layers, forming an active region on the first cladding layer, forming a second cladding layer on the active region, forming second mirror layers on the second cladding layer, defining active regions and inactive regions by forming isolation regions in the VCSEL layers, and then forming photodiodes distributed across the wafer on the second mirror layers of inactive VCSELs.

In still another aspect, the present invention provides a method of manufacturing monolithic VCSEL and photodetector pairs by forming VCSEL layers directly on a semiconductor wafer substrate by forming first mirror layers, forming an active region on the first cladding layer, forming a second cladding layer on the active region, forming second mirror layers on the second cladding layer, forming photodiodes distributed across the wafer by forming distributed p-type layers on a topmost second mirror layer, forming an intrinsic layer on the distributed p-type layers, forming an n-type layer on the intrinsic layers, forming a photodiode cathode contact on each of the n-type layers, and forming distributed photodiode anode contacts on the topmost second mirror layer.

In another aspect, the present invention provides a method of manufacturing an integrated VCSEL and photodetector pair by forming layers of VCSEL on a semiconductor substrate, forming layers of a photodiode on a top-most layer of a first portion of the VCSEL layers, isolating a second portion of the VCSEL layers from the photodiode layers by implanting an isolation region between the first and second portions of the VCSEL layers, forming a VCSEL cathode contact connected to the semiconductor substrate, forming a VCSEL anode contact connected to the top-most VCSEL layer in the second portion, forming a photodiode cathode contact on a topmost layer of the photodiode layers, and forming a photodiode anode contact on the top-most VCSEL layer of the first portion of the VCSEL layers.

The present invention provides a method of manufacturing an integrated VCSEL and photodetector pairs by forming VCSEL layers directly on a semiconductor wafer substrate, then forming photodiodes distributed across the VCSEL layers at discrete locations, forming active and inactive regions of the VCSEL by forming isolation regions in the VCSEL layers, and isolating the VCSEL from the photodiodes by forming proton implant isolation regions around the photodiodes.

The present invention further provides a method of manufacturing an integrated VCSEL and photodetector pairs by forming VCSEL layers directly on a semiconductor wafer substrate; then forming photodiodes on the VCSEL at discrete locations, forming a photodiode n-type contact (cathode) on the upper most photodiode layer; and forming a photodiode p-type contact (anode) on the upper most VCSEL layer, forming a VCSEL p-type contact (anode) on the topmost VCSEL layer; forming a VCSEL n-type contact (cathode) coupled to the semiconductor substrate; forming active and inactive regions of the VCSEL by creating isolation regions in the VCSEL layers; then isolating the VCSEL layers from the photodiodes by forming proton implant isolation regions around the photodiodes.

In another aspect, the present invention provides a method of manufacturing monolithic VCSEL and photodetector pairs by forming VCSEL layers directly on a semiconductor wafer substrate, then forming an etch stop layer on the VCSEL layers, then forming photodiodes distributed across the wafer directly on the etch stop layer at discrete locations.

In still another aspect, the present invention provides a method of manufacturing monolithic VCSEL and photodetector pairs by forming VCSEL layers directly on a semiconductor wafer substrate by; forming first mirror on the substrate, forming a cladding layer on the first mirror, forming an active region on the first cladding layer, forming a second cladding layer on the active region, forming a second mirror on the second cladding layer, forming an etch stop layer on the second mirror, forming photodiodes distributed across the wafer at discrete locations by forming distributed p-type layers on a top most second mirror layer, forming an intrinsic layer on the distributed p-type layers, forming an n-type layer on the intrinsic layers, forming a photodiode n-type contact on each of the n-type layers, and forming distributed photodiode p-type contacts on the topmost second mirror.

In still another aspect, the present invention provides a method of manufacturing monolithic VCSEL and photodetector pairs by: forming VCSEL layers directly on a semiconductor wafer substrate; then forming an etch stop layer directly on the VCSEL; then forming photodiode layers distributed across said etch stop layer at discrete locations then forming a photodiode n-type contact (cathode) on said upper most photodiode layer; and forming a photodiode p-type contact (anode) on said upper most VCSEL layer; then forming a VCSEL p-type contact (anode) on said topmost VCSEL layer; forming a VCSEL n-type contact (cathode) coupled to said semiconductor substrate; defining active and inactive regions of the VCSEL by forming isolation regions in the VCSEL layers; then isolating said VCSEL layers from said photodiodes layers by forming proton implant isolation regions around said photodetector.

In still another aspect, the present invention provides a method of manufacturing monolithic VCSEL and photodetector pairs by: forming VCSEL layers directly on a semiconductor wafer substrate; then forming photodiode layers distributed across the VCSEL layers at discrete locations; forming a photodiode n-type contact (cathode) on said upper most photodiode layer; and forming a photodiode p-type contact (anode) on said upper most VCSEL layer; forming a VCSEL p-type contact (anode) on said topmost VCSEL layer; forming a VCSEL n-type contact (cathode) coupled to said semiconductor substrate; defining active and inactive regions of the VCSEL by forming isolation regions in the VCSEL layers; then isolating said VCSEL layers from said photodiodes layers by forming proton implant isolation regions around said photodiodes, forming interconnect metal pads on said photodiode anode and cathode and VCSEL anode; forming a dielectric matching layer on said VCSEL layers; forming vias in the dielectric matching layer for the interconnect metal pads; forming an anti-reflective coating on said photodetector.

In still another aspect, the present invention provides a method of manufacturing a monolithic VCSEL and integrated photodetector preamplifier by: forming VCSEL layers directly on a semiconductor wafer substrate; then forming an etch stop layer on the uppermost VCSEL layer; forming photodiodes distributed across said wafer directly on said VCSEL layers at discrete locations; then forming one or more transistors coupled to the photodiode.

In still another aspect, the present invention provides a method of manufacturing an integrated photodetector preamplifier by forming photodiodes directly on a semiconductor wafer substrate, and then forming one or more transistors coupled to the photodiodes.

BRIEF DESCRIPTION OF THE DRAWINGS

The foregoing objectives and the features of the preferred embodiments of the present invention will be better understood by those skilled in the art with reference to the following detailed description in conjunction with the accompanying drawings, wherein:

FIG. 1($b$) (prior art) illustrates an optical assembly of a typical implementation of a high-speed data transmission link using a single optoelectronic device for each half of a duplex channel.

FIG. 1($c$) (prior art) illustrates a schematic view of the fiber assembly of FIG. 1($a$) and the optical assembly of FIG. 1($b$).

FIG. 1($d$) (prior art) illustrates the high-speed duplex data communications module using known precision manufactured parts to implement the transmit and receive links of a high-speed duplex data communications channel of FIG. 2.

FIG. 3 illustrates a cross-section of an integrated VCSEL and an MSM photodetector in accordance with the present invention.

FIG. 4 illustrates a monolithic plan view of a preferred embodiment of the invention.

FIG. 5($a$) illustrates a cross-section of a VCSEL and a p-i-n photodiode in accordance with the present invention.

FIG. 5($b$) is a simplified circuit diagram of the VCSL laser diode illustrated by the cross-section in FIG. 5($a$);

FIG. 5($c$) is a simplified circuit diagram of the p-i-n photodiode illustrated by the cross-section in FIG. 5($a$);

FIG. 6($a$) (prior art) illustrates a commercially available dual fiber version of a round fiber ferrule.

FIG. 6($b$) (prior art) illustrates a commercially available rectangular multifiber ferrule.

FIG. 8 illustrates how a transmit and receive pair made in accordance with the present invention can be packaged to interface with a round multifiber ferrule such as the one illustrated in FIG. 6(a).

FIG. 14(a) is a cross-section demonstrating the integration of Ohm vias into the dielectric layer for the photodiode and VCSEL in accordance with the present invention.

FIG. 14(b) is a top view demonstrating the integration Ohm vias into the dielectric layer for the photodiode and VCSEL in accordance with the present invention.

DETAILED DESCRIPTION OF THE INVENTION

Figure 1C:
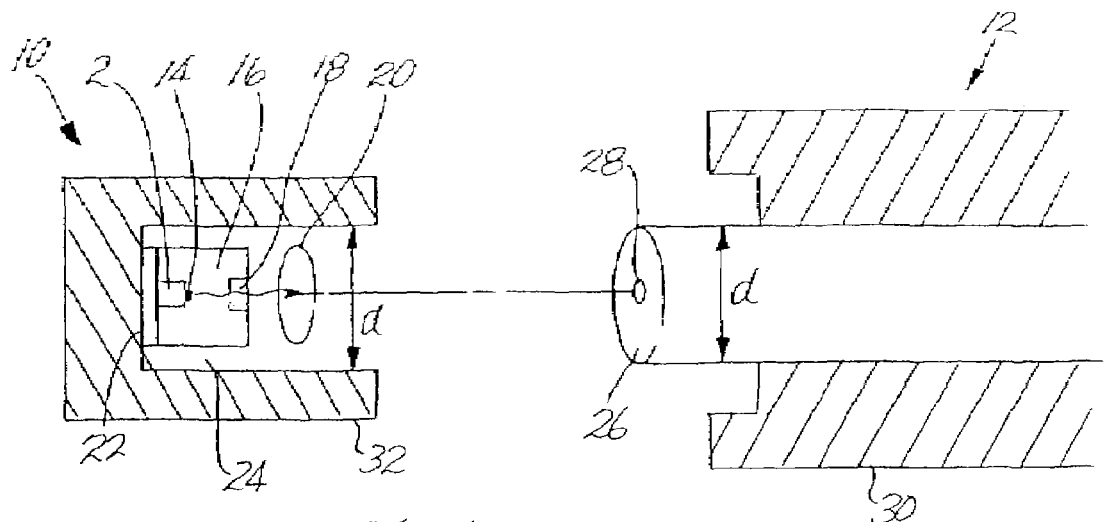
FIG. 1($a$) (prior art) illustrates a fiber assembly of a typical implementation of a high-speed data transmission link using a single optoelectronic device for each half of a duplex channel.
Figure 1D:
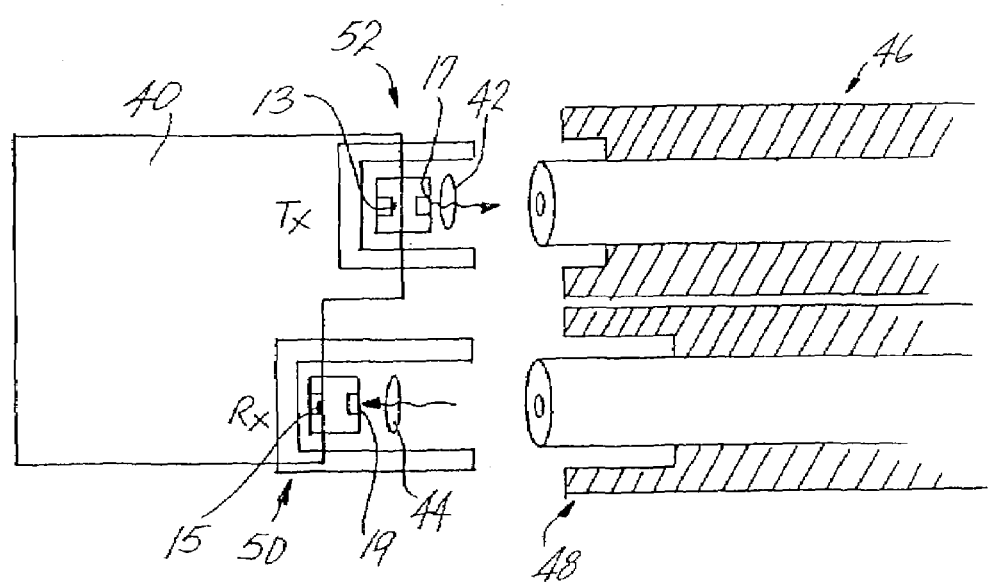
Figure 2:
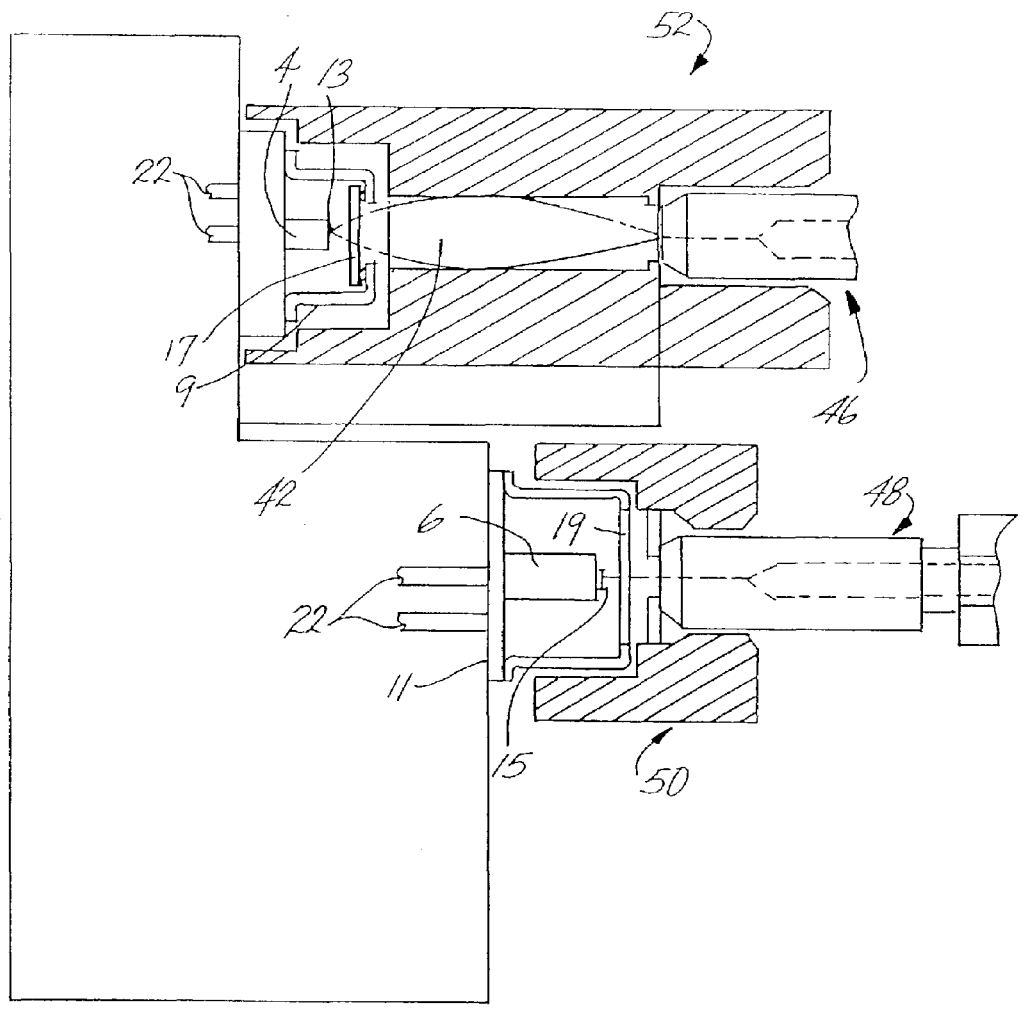
FIG. 2 (prior art) illustrates a high-speed duplex data communications module using known precision manufactured parts to implement the transmit and receive links of a high-speed duplex data communications channel.

The present invention generally pertains to a monolithic semiconductor device having a VCSEL integrated with a photodetector on the same substrate, wherein the VCSEL and photodetector are to be operated independently as transmit and receive devices respectively. The VCSEL and photodetector are physically situated in close enough proximity to permit packaging of one or more pairs of the VCSEL and photodetector such that they may be coupled to multifiber ferrules having fiber spacing on the order of 250 microns or less. The present invention also includes a method of manufacturing the independently operated VCSEL and photodetector, as well as the packaging and coupling of one or more pairs of the integrated VCSEL and photodetector to multifiber ferrules.

A first preferred embodiment of the invention is now discussed in detail in conjunction with FIGS. 3 and 4. As shown in FIG. 3, a VCSEL and a metal-semiconductor-metal (MSM) photodetector are integrated on the same semi-insulating GaAs substrate 60. The conductance of the semi-insulating substrate 60 is typically between about $10^{-12}$ and $10^{-5}$ ohm-cm. The VCSEL is built on top of the substrate 60 beginning with an n− layer 68, upon which an n+ layer 70 is grown to form the cathode of the VCSEL.

A first mirror 78 is formed on layer 70, which is preferably an epitaxially formed distributed Bragg reflector (DBR) which comprises a plurality of alternating semiconductor layers having high and low indices of refraction, with each layer having a thickness of $\lambda/4n$, where $\lambda$ is the wavelength of the optical radiation emitted from the laser and n is the index of refraction of the layer. The semiconductor layers are doped to achieve n-type conductivity. A quantum well (QW) active region 74 is formed between a first spacer 73 and a second spacer 75, with first spacer 73 formed on the top layer of the first mirror 78. Active region 74 has at least one QW layer.

A second mirror 76 is formed on second spacer 75 and is preferably an epitaxially grown DBR which is comprised of a plurality of alternating semiconductor layers having high and low indices of refraction, with each layer having a thickness of $\lambda/4n$, where $\lambda$ is the wavelength of the optical radiation emitted from the laser and n is the index of refraction of the layer. The second mirror 76 is doped to achieve p-type conductivity. An isolation implant 81 is formed around the second mirror 76, and preferably extends to a depth just inside spacer 75. A mesa region is then etched around the outside of the VCSEL 89 to a depth that exposes the cathode layer 70. A cathode contact 72 is then formed on the exposed surface of cathode layer 70, and an anode contact 82 is formed which overlaps the surface of isolation implant region 81 and the topmost layer of second mirror 76, and which further defines an aperture 88 which comprises a portion of the surface of the top-most layer of second mirror 76. Radiation 84 is emitted through aperture 88.

The MSM photodetector 62 is formed on the surface of the semi-insulating substrate 60 as two non-electrically coupled metal patterns 66 and 64, each having fingers that are interdigitated with one another. When one or both of the patterns is biased to some voltage, carriers generated by received light are swept to the anodes of the two diodes by the applied electric field. Because the MSM 62 operates without conducting any current through the substrate 60, there is virtually no electrical crosstalk or leakage between the VCSEL 89 and the MSM photodetector 62. Thus, the VCSEL 89 can emit radiation 84 from aperture 88 based on digital data to be transmitted while MSM photodetector 62 can receive radiation 86 in which is encoded digital data received from a remote data source. To achieve even better isolation, an isolation region 80 can be formed preferably by proton implant between VCSEL 89 and MSM photodetector 62.

FIG. 4 illustrates a plan view of the device that is shown as a cross-section in FIG. 3. For clarity, corresponding structures will be indicated by identical index numbers. The cathode layer 70 and its metal cathode contact 72 of the VCSEL are extended to the boundary of substrate 60, which is furthest away from MSM photodetector 62. Bond wire 71 can then be used to connect cathode contact 72 to a bond pad of, for example, a lead frame. The VCSEL anode contact 82 is brought to the same substrate boundary by bond wire 77, metal extender 79 and bond wire 69. Metal patterns 66 and 64, which form the anode and anode terminals of MSM photodetector 62, are also bonded to the leads of whatever form of packaging is used. One of the metal patterns is typically coupled to a bias voltage while the other is coupled to ground or a different bias voltage. An anti reflection coating can be employed on the MSM 62 to increase optical efficiency.

A second preferred embodiment is disclosed in FIG. 5a. For convenience and clarity, like structures will be denoted by the same index numbers as in previous figures. This particular embodiment is preferred because it can be implemented using more standard VCSEL manufacturing processes. A first mirror 78 is formed on a standard semiconductor GaAs substrate 79. The first mirror is preferably a semiconductor DBR comprising twenty to thirty periods of AlAs/AlGaAs layers. Each of the layers has a thickness of $\lambda/(4n)$ and is doped to have n-type conductivity. A first spacer or cladding layer 73 is then formed on first mirror 78, which is either undoped or very lightly doped. An active region 74 is then formed on the first spacer 73, which comprises at least one GaAs QW layer. A second mirror 76 is then formed on top of a second undoped or very lightly doped spacer or cladding layer 75. The second mirror 76 again preferably consists of alternating layers of AlAs/AlGaAs layers, each being $\lambda/(4n)$ thick. Second mirror 76 is doped to have p-type conductivity. On top of second mirror 76 is formed a thin etch-stop layer 93, which has a significantly higher ratio of Al to Ga, about 9 to 1 or greater. On top of the etch-stop layer 93, an extended p-type layer 100 of AlGaAs is formed. On top of p-type layer 100 is formed an intrinsic layer (i) 102 of undoped GaAs. Finally, an n-type layer 104 is formed on top of intrinsic layer 102.

The structure is then etched in those areas where a VCSEL is to be formed, and not etched where a p-i-n photodiode is to be formed. The etch strips away the n-type layer 104 and intrinsic layer 102 and continues into p-type layer 100 until the etch-stop layer 93 is detected. The etching process is terminated so that the etch-stop layer 93 is etched away and an appropriately thick top layer of second mirror 76 is exposed. Those of skill in the art will recognize that there are other well-known techniques by which the endpoint of an etching process may be detected to end the etching process at the appropriate time and which are intended to be within the scope of the present invention.

A proton isolation implant is performed to create isolation region 80 between VCSEL 92 and p-i-n photodiode 90. The implant region 80 typically achieves a depth, which extends just inside spacer layer 75 and has a width preferably between about 50 and 100 microns. A circular metal contact 82 is then formed on the top of mirror 76 and which overlaps slightly implant region 80. Contact 82 provides access to the anode of VCSEL 92. A contact 81 is then formed on the backside of substrate 79 and serves as the cathode terminal of VCSEL 92. Contacts 94 are preferably formed on both sides of p-i-n photodiode 90 which provide electrical access to the anode of p-i-n photodiode 90 as well as to the anode of the VCSEL 91, which underlies p-i-n photodiode 90. Finally, contact 96 is formed on n-type layer 104 to form the cathode of p-i-n in photodiode 90. An anti-reflection coating preferably having a thickness of about one quarter wavelength is applied to photo-receiving surface 101.

A simplified schematic of the structure of FIG. 5a is shown in FIG. 5b. VCSEL 92 is operated with forward bias between anode terminal 82 and cathode terminal 98 to produce radiation 84 having a wavelength of $\lambda$. The p-i-n photodiode 90 is operated with reverse bias between cathode contact 96 and anode contacts 94. Moreover, anode contacts 94 are shorted to substrate contact 98 to ensure that VCSEL 91 will not become forward biased and emit light. Thus, VCSEL 92 can be operated to emit light encoded with data to be transmitted to a remote receiver employing a similar structure, and p-i-n photodiode 90 can operate to receive radiation 86, which is encoded with data received from the same remote terminal.

Those of skill in the art will recognize many advantages of the second preferred embodiment of FIG. 5a is that a typical process used to create arrays of VCSELs, including the isolation implant commonly used to separate the individual VCSELs of the array, can be used to create arrays of VCSEL/p-i-n photodiode pairs. The additional steps required to build the p-i-n photodiode on top of the VCSEL process are negligible in cost. Moreover, the difference in the thickness of the two devices is also negligible for purposes of facilitating near-field coupling of the devices to fibers to eliminate the need for optics. Additionally, due to the underlying second mirror of inoperable VCSEL 91, any light not absorbed by the intrinsic layer 102 of p-i-n photodiode 90 will be reflected back into intrinsic layer 102, thus having a second chance to be absorbed. Finally, the thicker the intrinsic layer 102, the lower the capacitance of the p-i-n diode 90 (the faster its operation) and the better its optical efficiency.

FIG. 6(a) illustrates how the commonly used single fiber round ferrule can be implemented using two or more fibers. Such fibers are now currently available from Siecor as prototypes. The cylindrical ferrule 110 has the same dimensions (i.e., 2.5 mm) as those ferrules commonly used with only one fiber. Thus, one fiber 112 can be used for transmitting data as coupled to a VCSEL while fiber 114 can be used to receive data from a remote transmitter as coupled to a photodetector.

FIG. 6(b) illustrates a commonly available rectangular ferrule which can have eight or more fibers 122, and which has guides 120 for receiving alignment pins. Rectangular ferrule 116 typically has a polished face 118 for coupling to an array of transmitting VCSELs. This rectangular ferrule 116 can be easily adapted to devices made in accordance with the present invention, such that each pair of fibers 122 can be aligned with a pair of integrated VCSEL/photodetectors.

Figure 7A:
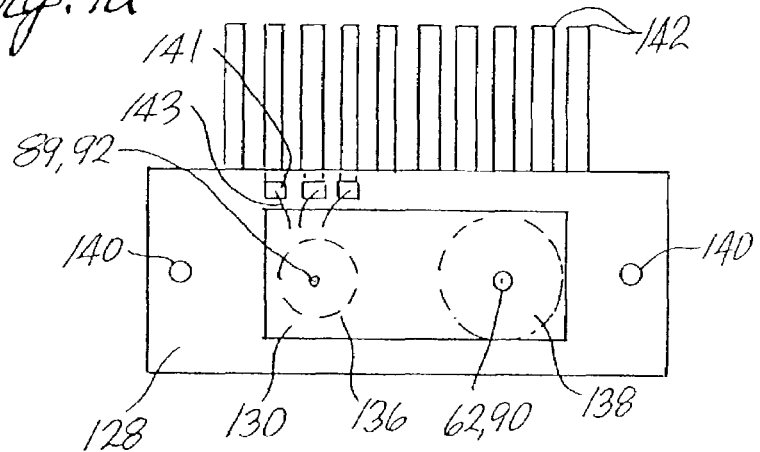
FIG. 7(a) illustrates how the present invention can be packaged using conventional lead-frame technology to facilitate interface to a rectangular multifiber ferrule.
Figure 7B:
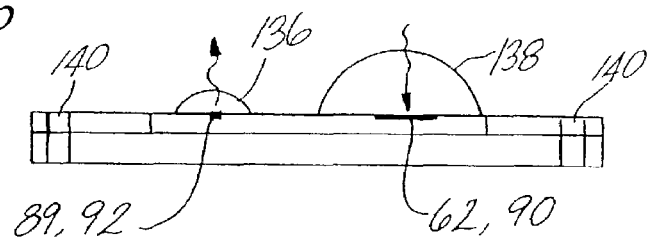
FIG. 7(b) illustrates how optical lenses can be integrated with the present invention.

FIG. 7(a) illustrates how a single VCSEL/photodetector pair could be packaged using standard lead-frame technology to be interfaced to a rectangular multifiber ferrule such as the one illustrated in FIG. 6(b). Integrated transmit/receive chip 130 can be epoxied to lead frame 128 and then bonded to bond pads 141 via bond wires 143. If optics are required, lenses 138 and 136 can be formed over VCSEL 89, 92 and photodetector 62,90 respectively, either using materials which are formed over chip 130 during the manufacturing of chip 130 or such optics can be integrated within the surface of the plastic encapsulation formed by the package. Lead frame 128 can also have guide pins 140 to be used in conjunction with a rectangular ferrule such as the one shown in FIG. 6(b). FIG. 7(b) shows a side view of FIG. 7a to illustrate the use of optics over photodetector 62, 90 and VCSEL 89, 92.

Figure 7C:
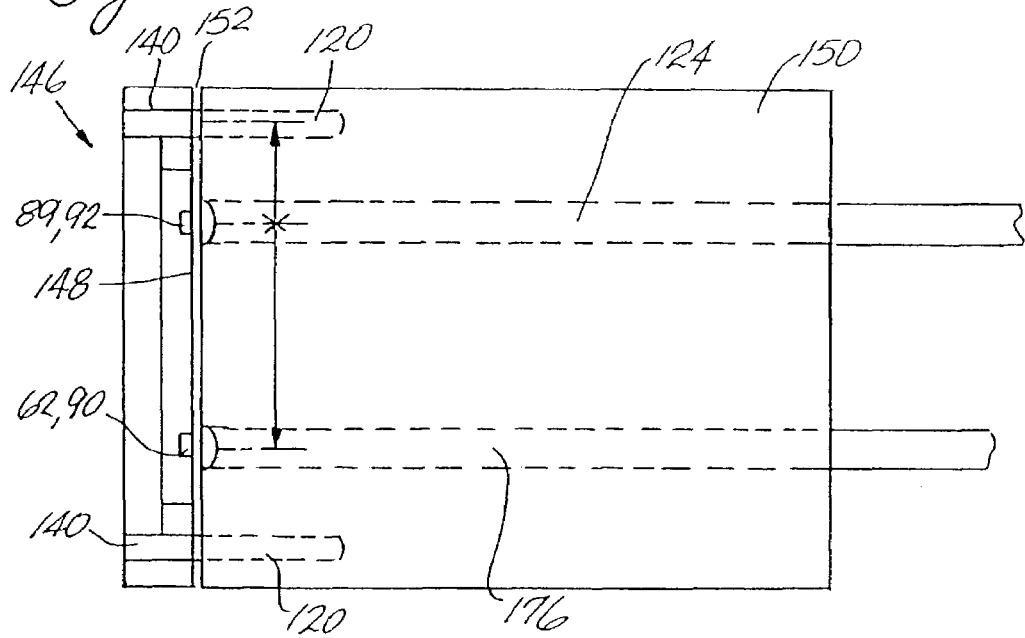
FIG. 7(c) illustrates how the present invention can be implemented using butt coupling technology.

FIG. 7(c) illustrates how lead frame 128 can be butt coupled to a rectangular ferrule 150 containing two fibers 124 and 126. If distance 160 is fairly precisely known, and distance 147 between fibers 124 and 126 is fairly precise, a fairly accurate alignment can be achieved between fibers 124 and 126 and VCSEL 89, 92 and photodetector 62, 90 because the distance between VCSEL 89, 92 and photodetector is 62, 90 are fairly precise based on the photo-optical alignment process used in manufacturing the integrated semiconductor 130. Thus, a fairly accurate positioning of the chip 130 with respect to the lead frame 128 during packaging will provide a reasonably accurate passive alignment. Of course, fine alignment can be achieved using well-known active alignment techniques. A further advantage of the coupling technique shown in FIG. 7 is that no optics must be interposed between package 128 and ferrule 150 if the coupling distance 152 is close enough. Of course, a flat transmissive surface 148 can be easily achieved on package 128.

FIG. 8 illustrates a lead-frame package which can be used to interface with a round multifiber ferrule such as the two fiber ferrule of FIG. 6(a) Barrel 127 is designed to precisely mate with the round ferrule of FIG. 6(b).

An alternate embodiment of the present invention relates to a monolithic semiconductor device having a VCSEL integrated with a photodetector and preamplifier on the same substrate, the VCSEL and photodetector to be operated independently as a transmit and receive device respectively. The present invention also includes a method of manufacturing the independently operated VCSEL and photodetector with integrated FET preamplifier.

Figure 9:
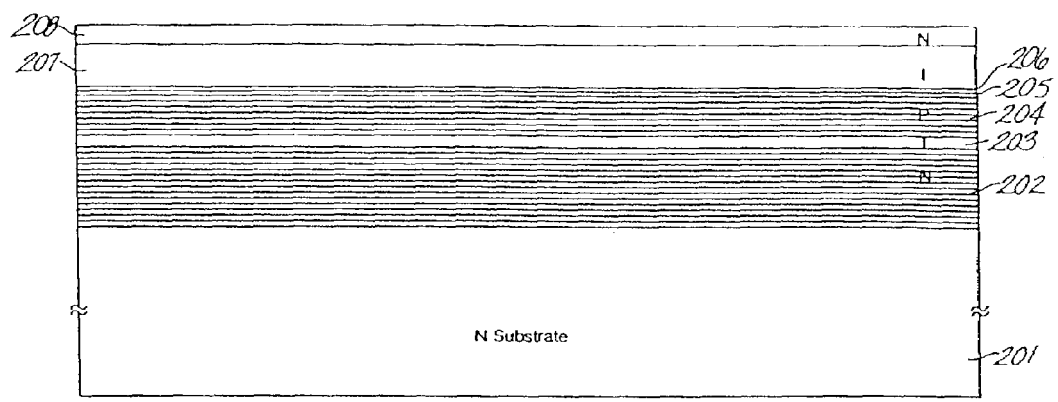
FIG. 9 is a cross-section of a conventional VCSEL structure deposited upon a semiconductor substrate with a p-i-n photodiode formed on the VCSEL in accordance with the present invention.

This alternate embodiment of the present invention is implemented using standard VCSEL manufacturing techniques. The conventional VCSEL portion of this alternative embodiment of the present invention as shown in FIG. 9 includes a substrate 201, a first or lower mirror 202, an optical cavity 203, and a second or upper mirror 204. The substrate 201 is made of gallium arsenide (GaAs) or any other suitable material. The first and second mirrors 202, 204 are comprised of multilayered distributed Bragg reflectors (DBRs) as is conventional in the art. In this alternate embodiment, aluminum gallium arsenide (AlGaAs) and aluminum arsenide (AlAs), with varying concentrations of aluminum and gallium are used to fabricate the upper and lower mirrors 202, 204. The optical thickness of each mirror layer is typically designed to be a quarter wavelength of the emitted light of the laser where the optical thickness is given by the product of the physical thickness and the index of refraction.

The conventional optical cavity 203 includes an active region surrounded by first and second cladding regions. The first and second cladding regions are made of AlGaAs in the exemplary embodiment. In the active region 203, at least one quantum well made of GaAs is disposed on adjacent barrier layers made of $Al_{0.25}Ga_{0.5}As$. As is generally understood in the art, the number of and materials forming the quantum wells and surrounding barrier layers can be varied depending on the design.

In this alternate embodiment, the first or lower mirror 202 is doped to n-type conductivity while the second or upper mirror 204 is doped to have p-type conductivity. The p-type second mirror 204 is capped by a layer of GaAs 205, which is approximately 100 Angstroms thick.

A thin etch stop layer 206, consisting of approximately 100–200 Angstroms of AlAs is deposited on the p-type mirror cap 205. On top of the etch stop layer 206 an additional intrinsic i-type layer 207 is deposited, consisting of an absorbing GaAs material. The p-doping extends through the AlAs etch stop layer 206 into the i-type region 207 to avoid heterostructural barriers and band problems. Finally an n-type layer 208 of $Al_{00.25}Ga_{0.75}As$ is formed on top of the intrinsic layer 207 with a thin GaAs cap.

This alternate embodiment minimizes photodetector pulse deformation due to minority carrier drift within the p-i-n photodiode 211 structure. The GaAs i-type layer 207 absorbs light at 850 nanometers whereas the n-type layer 208 is non-absorbent at this wavelength. Therefore, photon absorption is confined to the i-type layer 207 wherein the photons are removed by the reverse electric fields. If photocarrier absorption occurs in the n-type region 208 or the p-type region 204 on either side of the i-type region 207, minority photons are absorbed, and minority carriers are generated. There is no electric field within the background doped n-type region 208 or p-type region 204 to remove these minority carriers. These minority carriers must then drift and diffuse through normal diffusion processes eventually being swept into the i-type region 207. This diffusion processes deforms the shape of the photodetector output pulse by creating a long time tail to the trailing edge of the pulse.

Figure 10A:
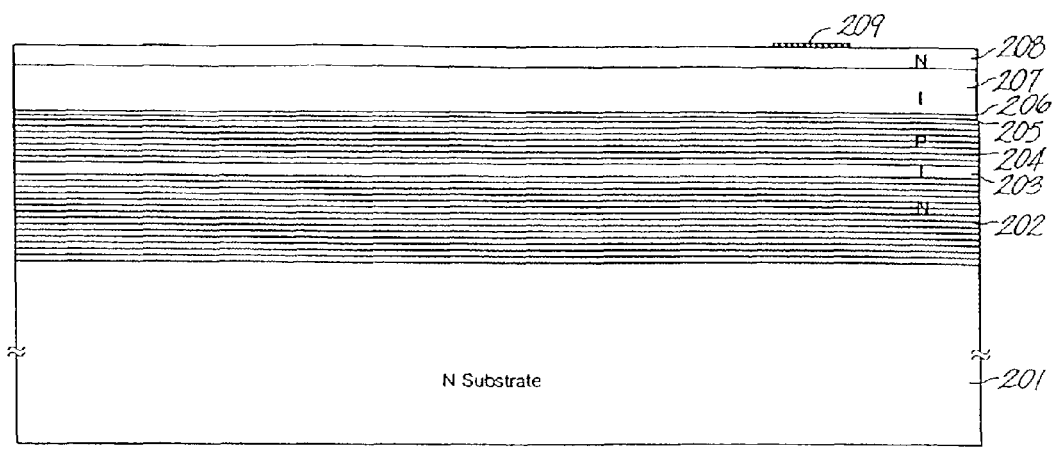
FIG. 10(a) is a cross-section of a conventional VCSEL structure deposited upon a semiconductor substrate with a p-i-n photodiode formed on the VCSEL having an integrated n-ohmic ring formed on the photodiode in accordance with the present invention.
Figure 10B:
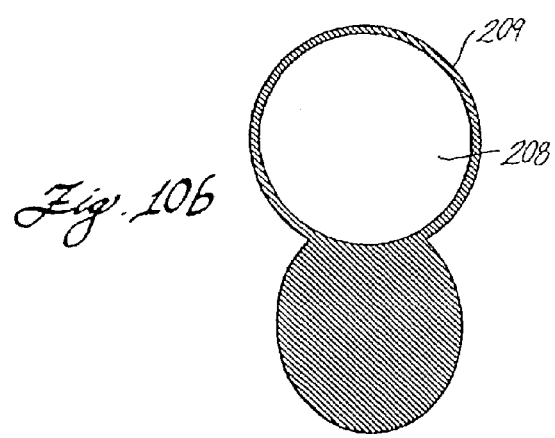
FIG. 10(b) is a top view demonstrating the integration of a p-i-n photodiode mesa on a VCSEL with an n-ohmic ring formed on the photodiode in accordance with the present invention.

As shown in the cross-sectional view of FIG. 10(a) circular n-ohmic 209 is formed to make contact with the photodiode n-type region 208 while the surface is planar. FIG. 10(b) is a top view of the ring contact 209 deposited on the n-type region 208. The structure is then masked and etched in those areas where the transmit VCSEL 210 is to be formed, FIG. 11(a), and not etched where the photodetector 211 is to be formed. There are well known techniques by which the endpoint of an etching process may be detected to end the etching process at the appropriate time. A disadvantage of these etch techniques is the non-uniformity of etch rates over the surface of the wafer. Etch rate variation is created by fluid motion, surface effects, light effects and various other phenomenon. This variation in etch rate results in imperfections in the surface finish of the VCSEL and added complexity in the manufacturing control process.

Figure 11A:
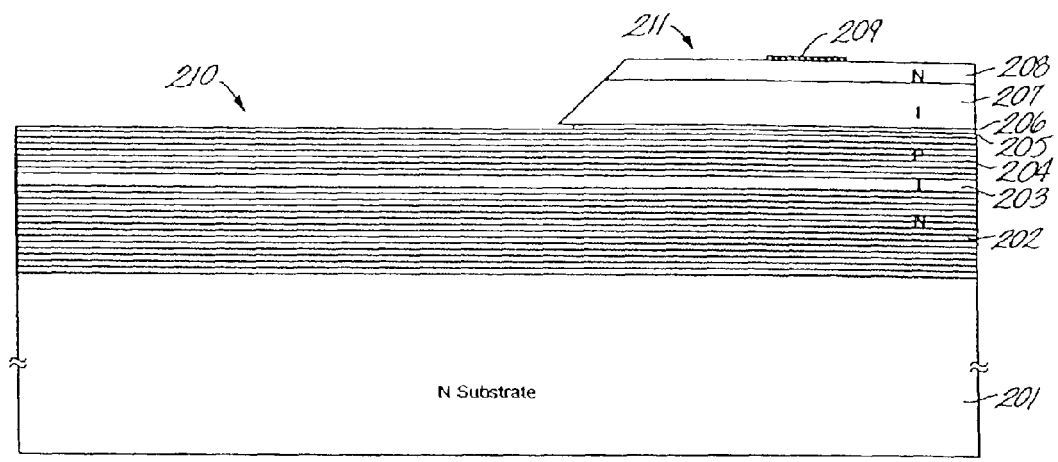
FIG. 11(a) is a cross-section of a VCSEL with an integrated p-i-n photodiode mesa, with an n-ohmic ring formed on the photodiode in accordance with the present invention.
Figure 11B:
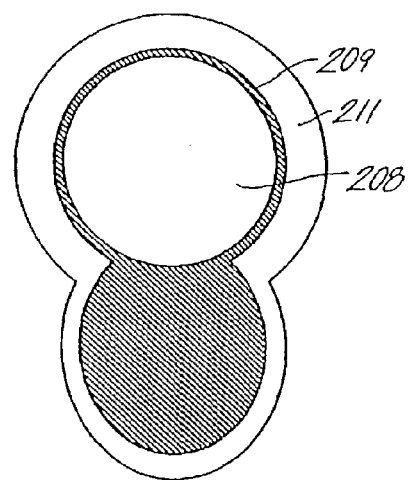
FIG. 11(b) is a top view demonstrating the integration of the p-i-n photodiode mesa on a VCSEL, with an n-ohmic ring formed on the photodiode mesa in accordance with the present invention.

In response to the drawbacks of the prior art, this alternate embodiment of the present invention incorporates an AlAs etch stop layer 206 to facilitate selective etching of the upper n-type region 208 and i-type region 207. The n-type region 208 and i-type region 207 are etched using a known combination of citric acid with a high percentage of peroxide. When the etch solution reaches the etch stop layer 206 the peroxide interacts with the AlAs to form an oxide surface. The citric acid solution is not sufficiently strong to remove the aluminum oxides so that the oxide surface in effect inhibits or stops the etch. This selective etch technique removes the time critical aspect of conventional etch techniques and greatly simplifies the manufacturing process. From a timing standpoint, the device can now be over etched assuring the uniform removal of the upper n-type region 208 and i-type region 207 over the entire surface of the VCSEL 210. Next, the etch stop layer 206 is removed using an alternate etch solution which will not etch the GaAs cap 205 on the upper p-type mirrors 204. Preferably, a solution of hydrochloric acid, with 10 percent water is used to remove the etch stop layer 206. As is shown in FIG. 11(a), a photodetector mesa 211, with a slight undercut in the AlAs etch stop layer 206, is closely coupled to a surrounding VCSEL 210. The present invention achieves the required device uniformity without implementation of rigorous process controls required by other known techniques. FIG. 11(b) is a top view of the photodetector mesa 211 with integrated n-type contact 209.

Figure 12A:
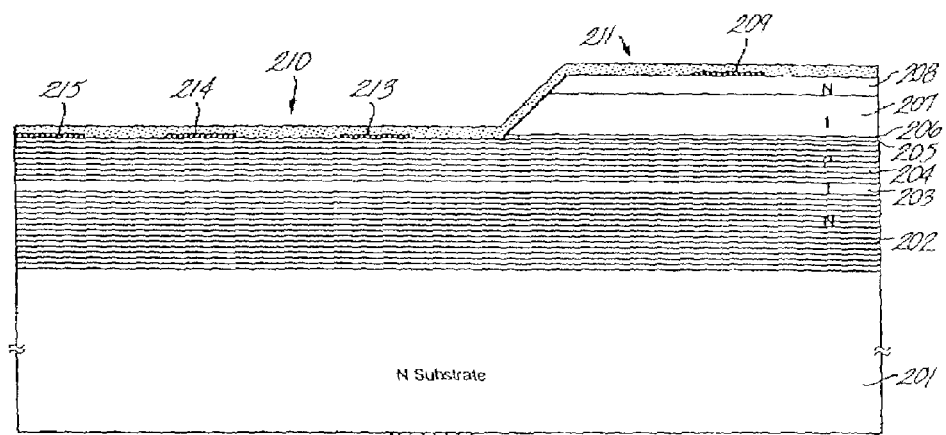
FIG. 12(a) is a cross-section of a VCSEL and associated p-ohmics, integrated with a p-i-n photodiode mesa, having a n-ohmic ring formed on the mesa and a p-ohmic ring formed on the photodiode mesa, in accordance with the present invention.
Figure 12B:
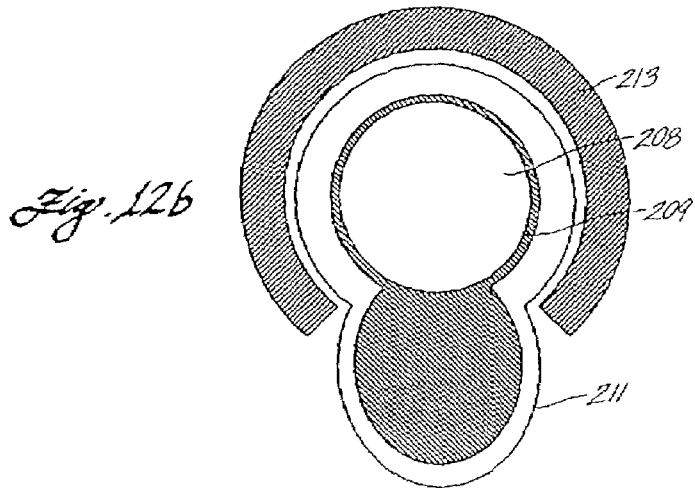
FIG. 12(b) is a top view demonstrating the integration of the p-i-n photodiode mesa on a VCSEL, with n-ohmic and p-ohmic rings in accordance with the present invention.

Referring to FIG. 12(a) in this alternate embodiment of the present invention, a metal contact 212 is formed on the bottom of the substrate 201 and serves as the cathode 212 terminal of the VCSEL 210. The contact metalization forming the n-ohmic contact 212 on the bottom of the substrate 201 may be, for example, eutectic gold germanium deposited by electron beam evaporation or sputtering. Additionally, p-ohmic contacts 213, 214 and 215 are then formed on the top of the second or upper mirror 204. As shown in the top view of FIG. 12(b) a circular metal contact 213 is formed on the outside of the photodetector 211, while at the same time circular contacts 214, 215 are formed on the upper most surface 205 of the VCSEL 210. The top contact metalization forming p-ohmic contacts 213, 214, and 215 may be, for example, gold with 2 percent beryllium added or a layered structure of titanium/platinum/gold, preferably deposited by electron beam evaporation.

Figure 13A:
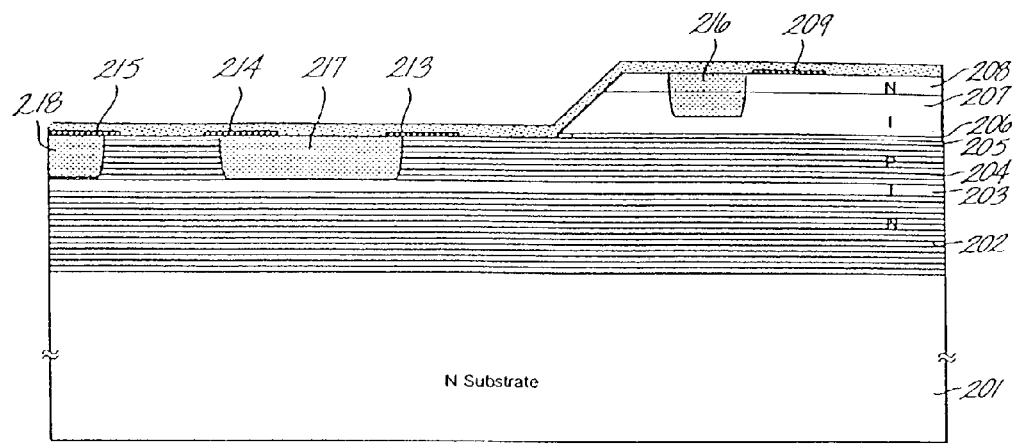
FIG. 13(a) is a cross-section demonstrating the integration of proton implant isolation regions in accordance with the present invention.
Figure 13B:
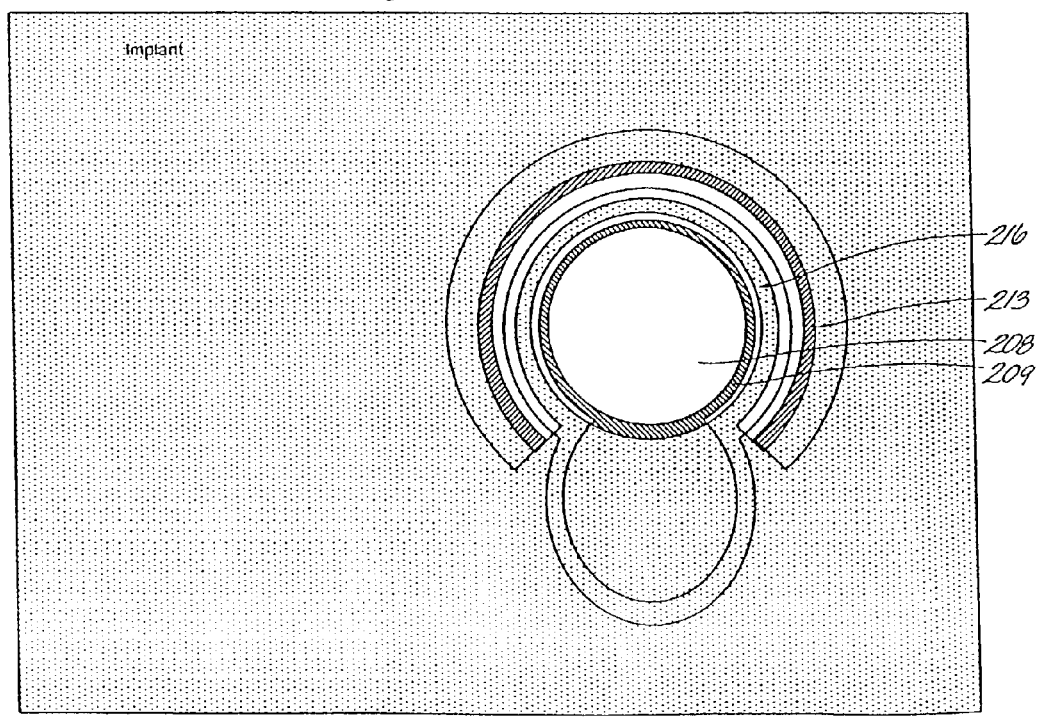
FIG. 13(b) is a top view demonstrating the integration of the p-i-n photodiode mesa on a VCSEL, with proton implant isolation regions in accordance with the present invention.

In this alternate embodiment of the present invention, a proton implant is performed to create an isolation region 216 between the VCSEL 210 and the photodetector 211 (FIG. 13(a)). The standard proton implantation process that is used for current constriction within the conventional VCSEL 217, 218, is used to create a highly insulative guard band 216 (top view FIG. 13(b)) around the photodetector 211 thereby isolating the VCSEL 210 structure from the photodetector 211. In the top view of FIG. 13(b), it can be seen that a guard band 216 of highly insulative material is formed between the n-type contact 209 and the p-ohmic contact 213 of the photodetector 211. This alternate embodiment has several advantages over prior art isolation mechanisms. For example, the operating time constants of a p-i-n photodetector 211 are inversely proportional to the capacitance of the device. The capacitance of the device is directly proportional to the surface area of the device. As is shown in the top view of FIG. 13(b) the highly insulative guard band 216 decreases the active surface area of the device, thereby reducing the capacitance of the device and increasing the maximum operating speed of the photodetector 211.

The photodetector guard band 216 also increases the sensitivity of the photodetector 211 by eliminating leakage paths through which current could otherwise flow between the VCSEL 210 and the photodetector 211. Typical photodetectors must receive very low optical power levels so that most photodetectors are low current devices. Therefore, a relatively small amplitude leakage current can severely degrade the sensitivity of the photodetector 211 by introducing excess noise into the receiver system as well as unacceptably changing the performance of the p-i-n photodetector 211 over time. The guard band region 216 effectively stops electrical conduction at the edge of the highly resistive guard band region 216 between the p-type contact 213 and n-type contact 209, thereby eliminating all leakage paths.

Current constriction within the conventional VCSEL 210 is provided by using proton implant regions 217 and 218 to creating active and inactive regions of the VCSEL. The VCSEL proton implant regions 217 and 218 convert the upper mirror DBR 204 into areas of high resistivity around the active VCSEL 210 device. The VCSEL proton implant regions 217, 218 typically achieve depths that extend just inside the spacer layer. In this alternate embodiment of the present invention, the thicknesses of the photodetector 211 i-type region 207 and n-type region 208 are chosen so that the implant depth that is appropriate for the VCSEL 210 is also appropriate for the photodetector 211. The forced commonality between the proton implant region 217, 218 of the VCSEL 210 and the proton implant guard band 216 of the photodetector 211 allows for a more efficient manufacturing process. The process sequence that was appropriate for the VCSEL 210, with a modified mask layout is also appropriate for the photodetector 211. Therefore, all proton implantations 216, 217 and 218 can be performed in a single process step with a single mask layout.

Referring to FIG. 13(a), the photodetector proton implant region 216 completely transects the n-type region 207 and penetrates into the i-type region 208. However, the proton implant region 216 does not fully penetrate the p-type region 204 providing a conduction path to the p-type contact 213, to maintain the required continuity between the n-type contact 209 and p-type contact 213 of the photodetector 211. In this alternate embodiment of the present invention, the n-type region 208 is approximately 3000 Angstroms thick, the absorbing i-type region 207 is approximately 2.5 microns in thickness and the area where the p-type region extends over into the i-type region 207 is approximately 2000 Angstroms so that the entire thickness of the photodetector mesa 211 is approximately 3 microns.

A dielectric protective layer 219 (FIG. 14(a)) is deposited to protect the outermost surface 205 of the VCSEL 210 and the photodetector 211. Silicon nitride is preferably used for the dielectric protective layer 219. Therefore, vias must be etched into the dielectric protective layer 219 to provide access to the p-type contacts 214 and 215 of the VCSEL 210, as well as the n-type contact 209 and p-type contact 213 of the photodetector 211.

Figure 15A:
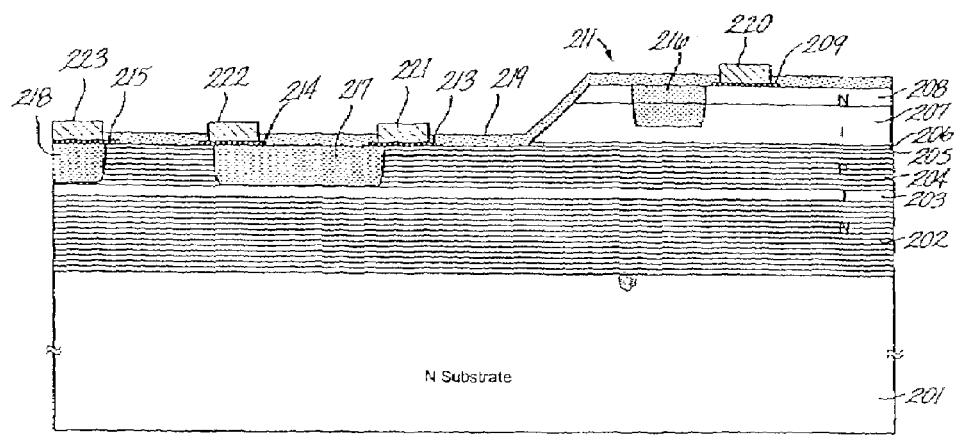
FIG. 15(a) is a cross-section demonstrating the integration of interconnect metal pads for the VCSEL and photodiode ohmic contacts in accordance with the present invention.
Figure 15B:
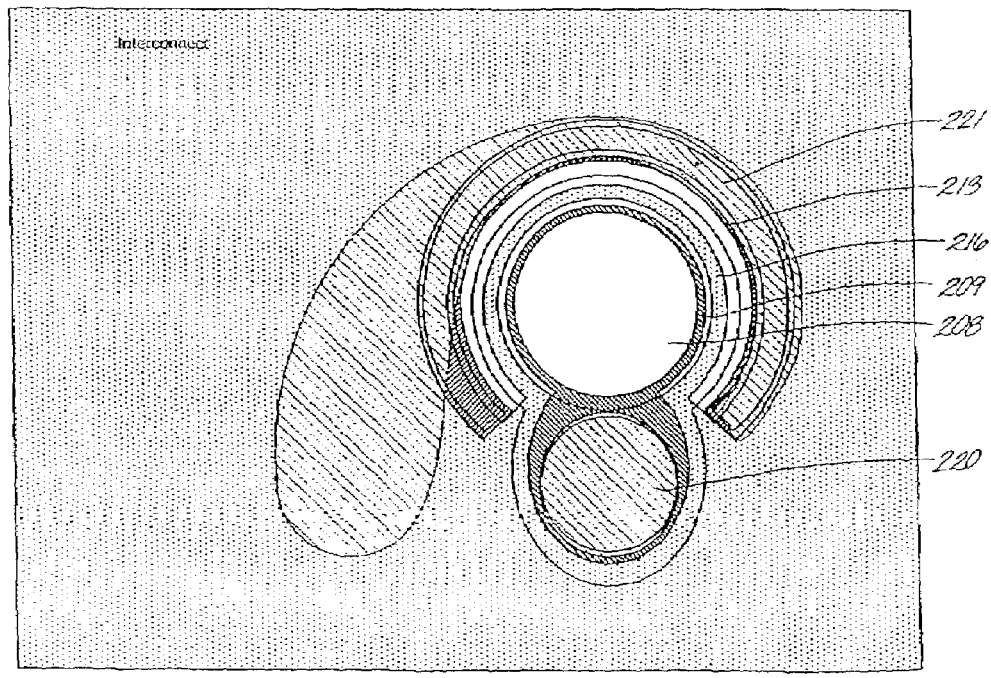
FIG. 15(b) is a top view demonstrating the integration of interconnect metal pads for the VCSEL and photodiode ohmic contacts in accordance with the present invention.

A thicker inter-connect metal 220 and 221 is deposited on the photodetector n-type contact 209 and p-type contact 213 respectively, as shown in the cross section of FIG. 15(a). Also, a thicker inter-connect metal 222 and 223 is deposited on the p-type contacts 214 and 215 of VCSEL 210. The inter-connect metal deposits 220–223, provide a low resistance, good electrical conductor contact for wire bonding, probing, etc. The metal deposits used for the n-type and p-type contacts 209, 213–215, are generally very thin and relatively high resistance and are designed for transitioning from metal to semiconductors through ohmic contacts that have a non-barrier between the work function of the two materials. Therefore, the inter-connect metal is chosen to provide low contact resistance for current flow. FIG. 15(b)

shows a top view of the interconnect metal 220 and 221 integrated with the photodetector 211.

Figure 16A:
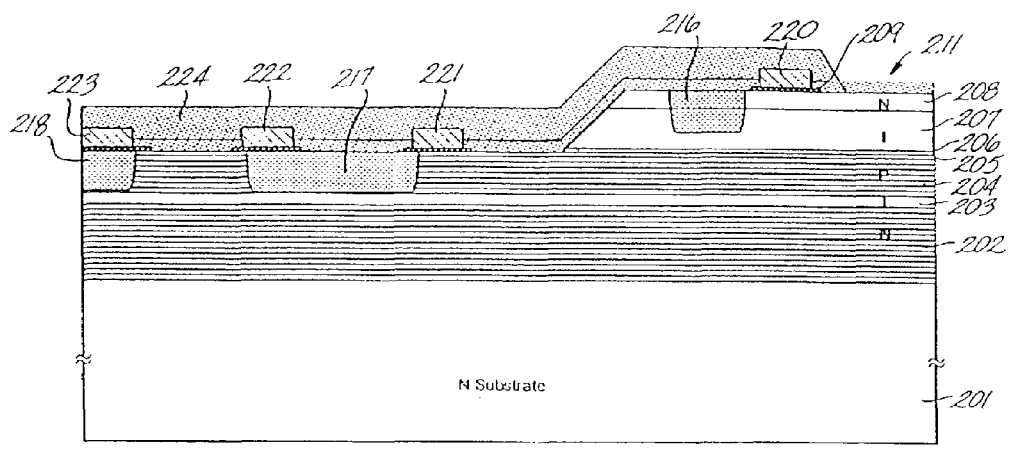
FIG. 16(a) is a cross-section demonstrating the integration of a VCSEL dielectric matching layer with photodiode via in accordance with the present invention.
Figure 16B:
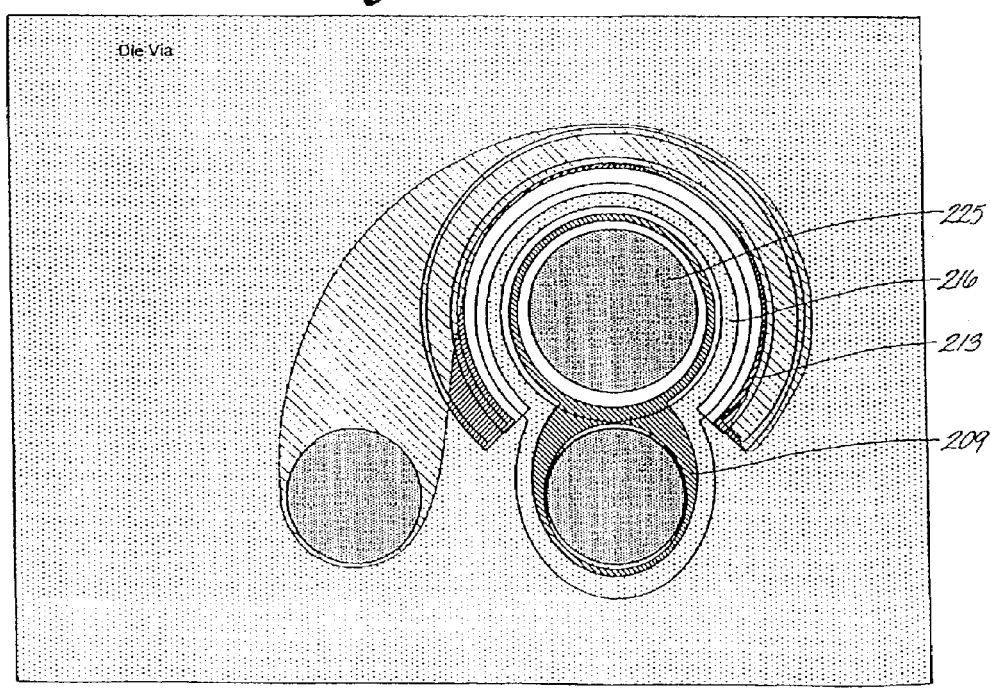
FIG. 16(b) is a top view demonstrating the integration of a VCSEL dielectric matching layer with photodiode via in accordance with the present invention.
Figure 17A:
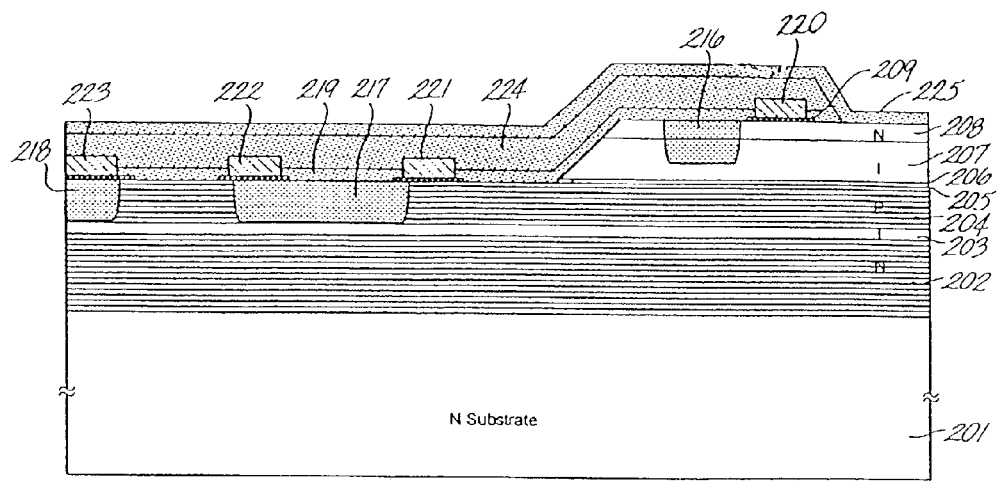
FIG. 17(a) is a cross-section demonstrating the integration of a one quarter wavelength anti-reflective coating on the photodiode in accordance with the present invention.
Figure 17B:
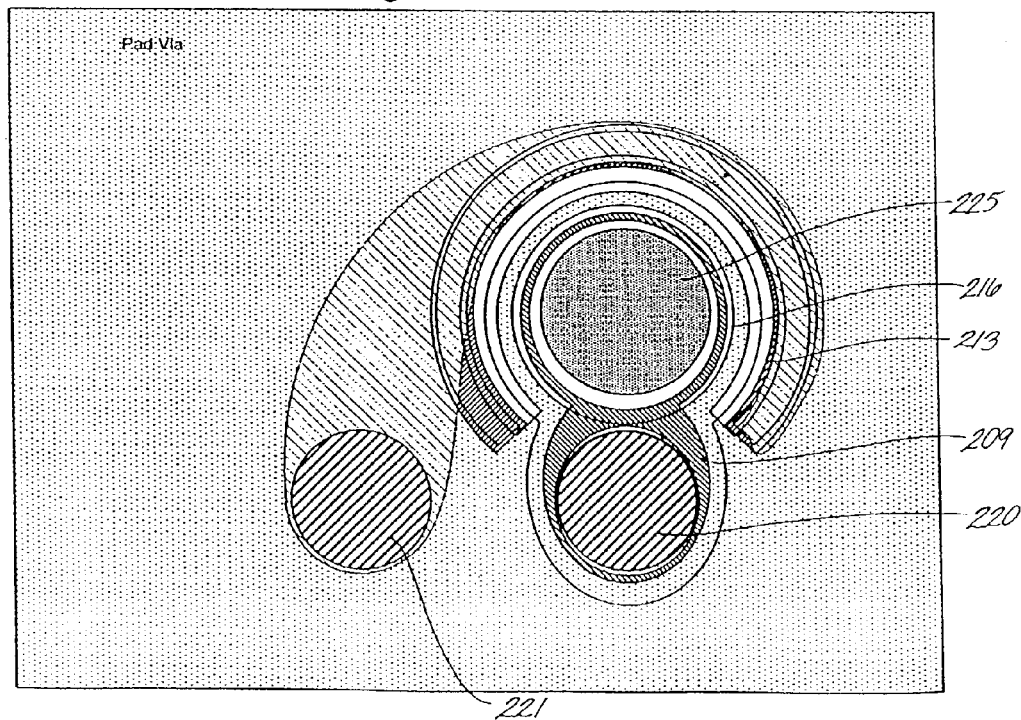
FIG. 17(b) is a top view demonstrating the integration of a one quarter wavelength anti-reflective coating on the photodiode in accordance with the present invention.

In an alternate embodiment of the present invention, a dielectric phase shifting layer 224, is preferably disposed on the conventional VCSEL structure 210 (FIG. 16(a)). The dielectric phase shifting layers 224 increase the total transmission out of the VCSEL 210 as is disclosed in U.S. Patent Application "VERTICAL CAVITY SURFACE EMITTING CONSISTENT SLOPE EFFICIENCIES", application Ser. No. 09/237,580; the contents of which are incorporated herein by reference. In this alternate embodiment of the present invention, deposition of the dielectric phase shifting layers 224 is halted prior to the deposition of the last quarter optical wavelength of the material. The dielectric phase shifting layers 224 are then completely etched off the photodetector 211 as shown in FIG. 16(a). Next a quarter optical wavelength of the dielectric material 225 is deposited over the VCSEL 210 to complete its mirror as well as on the photodetector 211 to create an anti-reflective coating (FIG. 17(a)). The quarter optical wavelength material is preferably silicon nitride as is known in the art.

When the anti-reflective coating 225 of silicon nitride is applied to the photodetector 211 n-type region, in conjunction with the p-type region of the upper mirror 204, which underlies the photodiode 211, a high degree of efficiency is achieved. The anti-reflective coating 225 increases the transmission of incoming light into the p-i-n photodiode structure 211. Additionally, any light that does not get absorbed in the i-type region 207 is reflected off the upper mirror 204 of the VCSEL 210 and is absorbed as it propagates back through the i-type region 207 for the second time. Because of this double pass mechanism the absorption characteristics of the i-type region 207 is twice what it otherwise would be, providing excellent quantum efficiencies, and very high response at gigabit speeds.

In an alternate embodiment of the present invention, a variable tuning layer (not shown) is deposited on the outer surface of the dielectric phase shifting layer 224. The variable tuning layer facilitates predictable adjustment of the optical efficiency of the laser during fabrication to achieve lasers with substantially similar slopes on a wafer-to-wafer basis. The manufacture and use of a variable tuning layer is disclosed in U.S. Provisional Patent Application "ENCAPSULATED LASER WITH CONTROLLED SLOPE EFFICIENCY", Application No. 60/125,916, filed on March 24, 1999, the contents of which are hereby incorporated by reference. In this alternate embodiment, the initial VCSELs are tested by any conventional technique, preferably on a representative sample, to determine characteristics of the initial VCSELs, such as the slope efficiency distribution. The thickness of the variable thickness dielectric layer required to tune the slope efficiency distribution to within the target specification is calculated. This calculated thickness is then used to interrupt the prior layer deposition, etch the dielectric layers off the photodetector and then deposit the remaining phase shifting layer thickness and tuning layer. If the calculated thickness of the dielectric tuning layers was ⅛ of a wavelength, the phase shifting layer deposition would be interrupted at ⅛ of a wavelength less complete, the dielectric would be etched off the photodetector 211 and the remaining phase shifting layer dielectric and tuning layer thickness would be deposited. The combination of the two materials would then be a quarter wavelength to complete the design of the anti-reflective coating 225 for the photodetector 211.

Figure 18A:
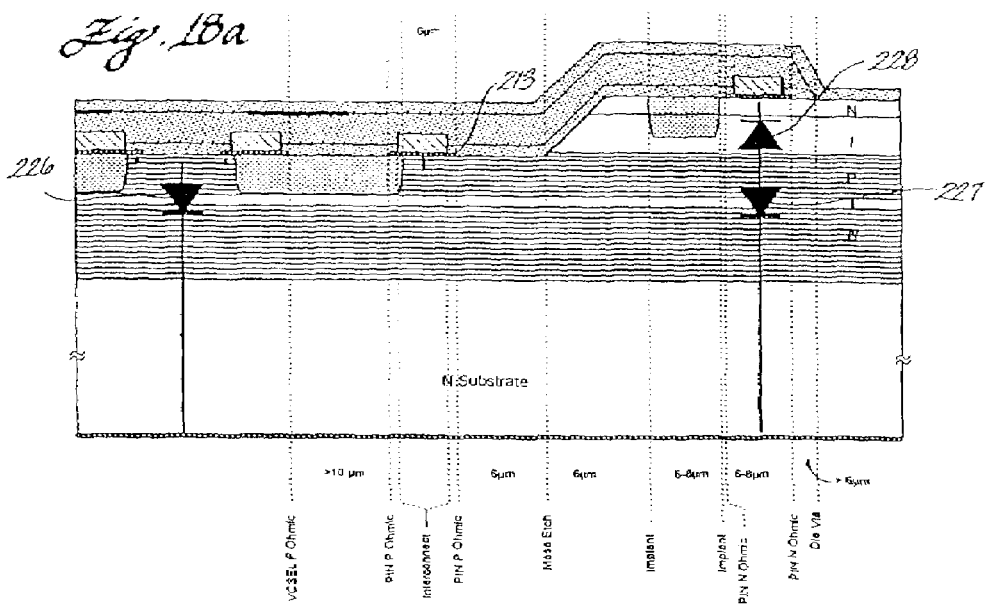
FIG. 18(a) is a cross-section demonstrating the mask layout to produce the present invention in accordance with the present invention.
Figure 18B:
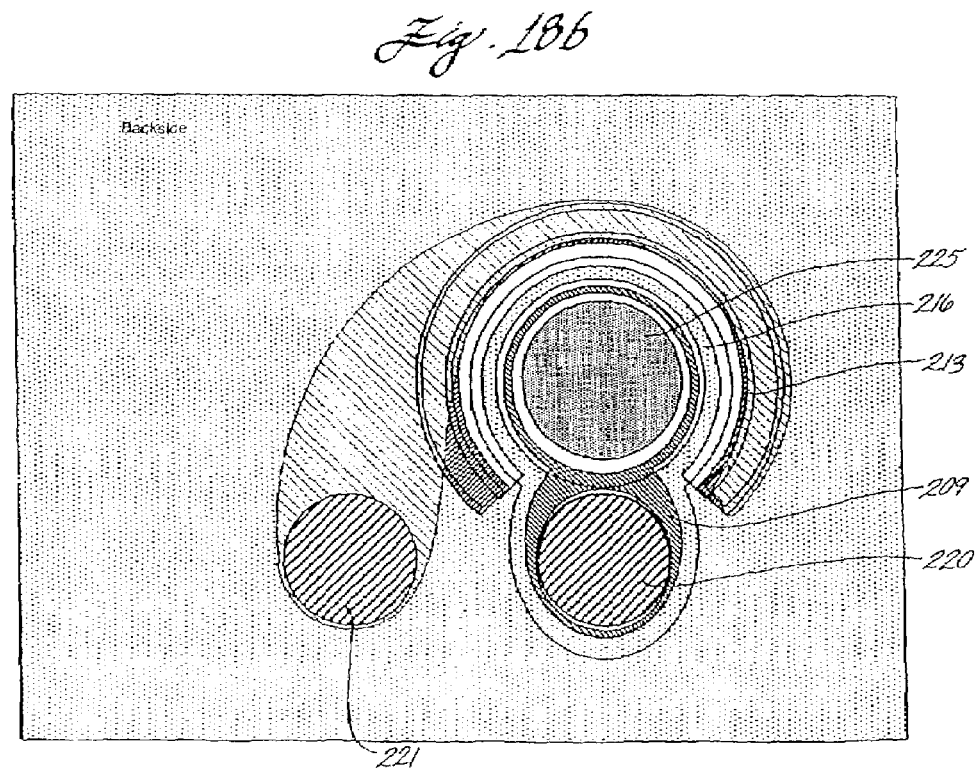
FIG. 18(b) is a top view demonstrating the mask layout to produce the present invention in accordance with the present invention

FIG. 18(a) is a cross section of the present invention, including the mask layout, with approximate dimensions, for manufacturing this alternate embodiment of the present invention. Also shown are the p-i-n laser 226, a parasitic VCSEL 227 underneath the photodetector 211 and the p-i-n photo diode 228. The p-type contact 213 of the p-i-n photodetector 211 may be coupled to ground so that the parasitic VCSEL 227 structure, which lies underneath the p-i-n photodetector 211, is never turned on and other bipolar parasitic effects are avoided.

Figure 19:
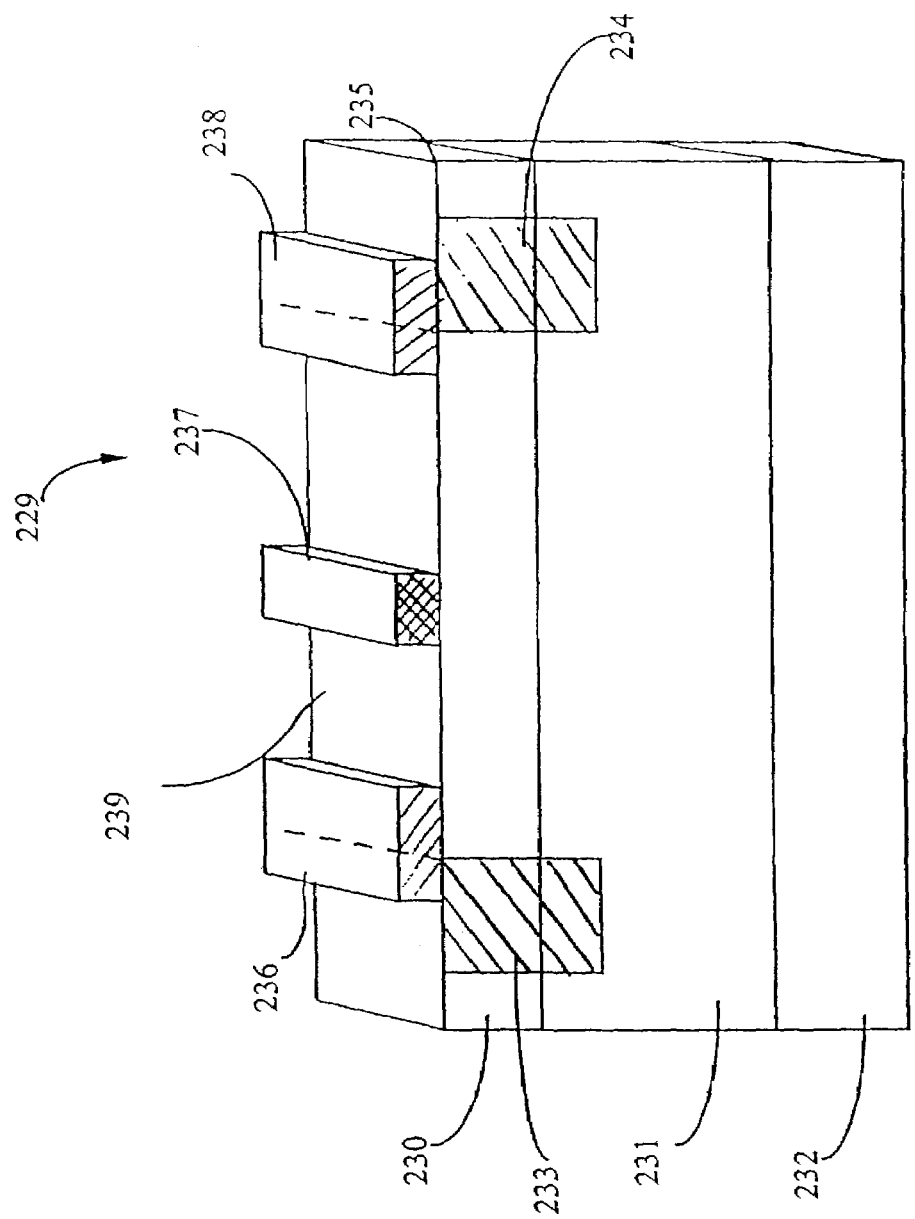
FIG. 19 is a perspective view demonstrating the integration of an FET with a p-i-n photodetector to form an integrated photodetector and preamplifier.

Referring to FIG. 19, in an alternate embodiment of the present invention, an epitaxial n-i-p structure, 230, 231 and 232 respectively, along with highly insulative proton implant regions 233 and 234, are used to integrate an FET onto the photodetector 211 to create an integrated detector pre-amplifier. FIG. 19 shows a perspective view of the integrated detector pre-amplifier 229. Metal deposits are formed on the outer most surface 235 of the photodetector 211 to form the source 236, gate 237 and drain 238 on an n-type channel of a typical transistor structure. In this alternate embodiment the proton implant regions 233 and 234 intersect the back of the source 236, gate 237 and drain 238 as well as the lower surface of the source 237 and drain 238. In this way the proton implant regions 233 and 234 form an isolated conductive region 239 or well, within a highly insulative field formed by the proton implantations 233 and 234. The width of the conductive region 239 is arbitrary and can be tailored to produce a predetermined transistor. To achieve gigabit data communication rates, the length of the gate 237, which is the critical transistor design parameter, can be on the order of one micron. The GaAs layer upon which the metal layers are deposited is a highly conductive material also with very good frequency response. A one-micron metal deposit is well within reasonable process control technology known in the art. The gate 237, is typically a layered structure of titanium, platinum and gold which can be deposited by any suitable method known in the art, such as by sputtering or electron beam vaporization. The thicknesses of the metal deposits are typically 500 Å, 1000 Å, and 3000 Å for the Ti, Pt, and Au respectively as is well known in the GaAs transistor art.

The source 236 and the drain 238 are typically layered structures of nickel with gold on gold germanium, n-ohmics. The nickel acts as a barrier to prohibit the gold from interfusing with the gold germanium and changing the eutectics of the gold germanium. In the preferred embodiment of the present invention a ratio of 88 percent gold to 12 percent germanium is used to form a eutectic, which has a phase melting point near 3600° C. to make a good ohmic contact.

This alternate embodiment of the present invention is less susceptible to receiver noise, crosstalk etc. than conventional photodetector designs. The coupled FET and photodetector create an integrated detector pre-amp such that the output signal of the photo detector is amplified by the FET and converted from a current signal to a voltage signal. Therefore, a relatively large voltage single is being modulated rather than a low level current signal. In conventional SMFF transceiver designs, the photodetector is susceptible to crosstalk from the high drive currents of the VCSEL as well as receiver noise and other degradations to receiver sensitivity. In this alternate embodiment the photo detector is integrated on the same mesa as the amplifying transistor circuitry so that the output signals of the integrated detector pre-amp are no longer very low current signals that are sensitive to noise, crosstalk and the like but are more stable amplified voltage signals.

The signal to noise ratio of conventional optical receiver is limited by the front-end noise. Currently, front end receivers which interface with conventional high speed photodetectors, utilize GaAs technology because high speed, highly sensitive, low noise performance is required to accurately amplify the low level current output of the conventional photodetector. In this embodiment of the present invention, the low noise circuitry is integrated with the photodetector on the same wafer. In this embodiment, the integrated amplifier is realized with relatively simple transistor circuits. The transistor circuits are readily implemented with techniques known in the art without resorting to the highly integrated processes required for GaAs integrated circuits. These relatively simple transistor circuits are generally bond pad limited. Coupling the photodetector to the transistors eliminates capacitance and bond wire inductance which otherwise limit system performance. The amplified output signal of the integrated detector preamplifier, which is no longer susceptible to noise and other degradations, allows the front end receiver amplifier to be implemented with CMOS integrated circuit technology that is comparably a much lower cost than the more complex GaAs integrated circuit technology required for conventional photodetectors.

Figure 20:
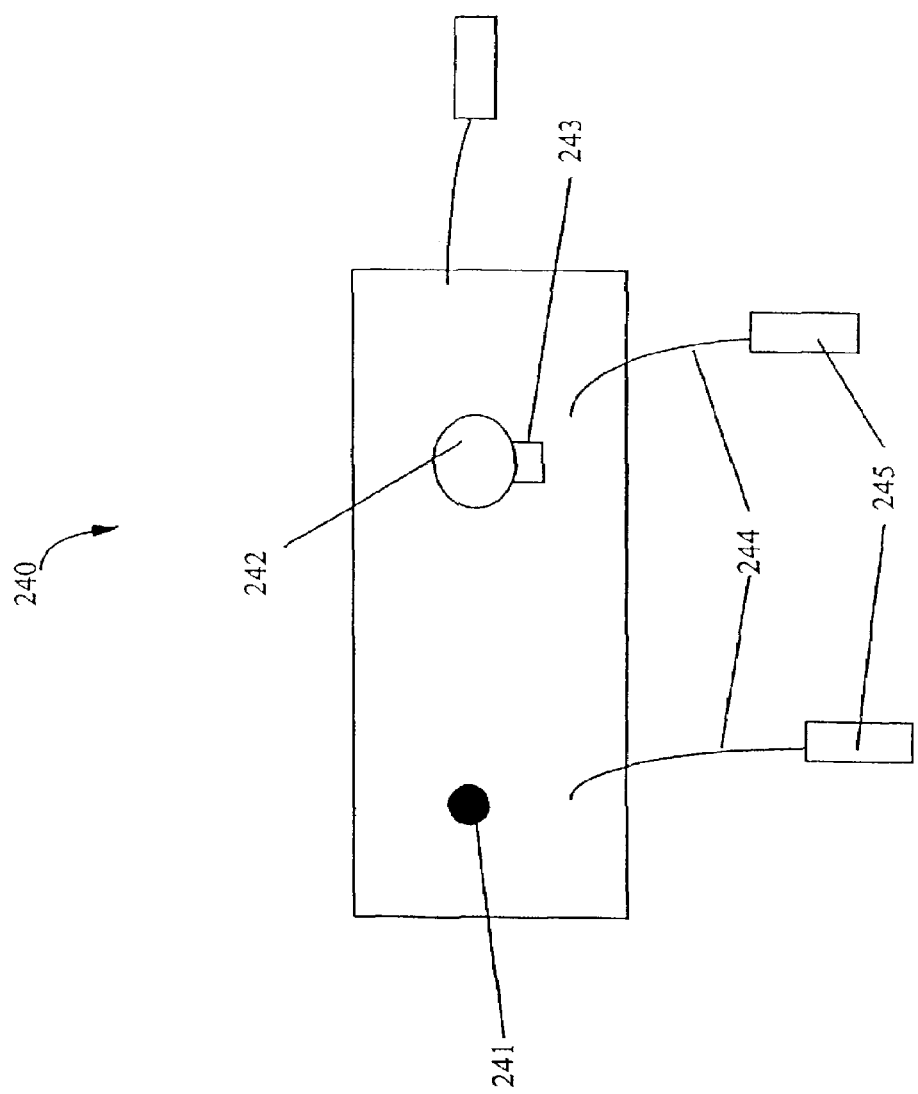
FIG. 20 is a top view of a transmit/receive/amplifier circuit integrated onto one wafer which utilizes low cost wire bond/lead frame technology.

In an alternate embodiment of the present invention the integrated detector preamplifier is coupled with VCSEL transmit technology to provide a closely spaced transmit 241, receive 242, amplifier 243 circuit 240 on a single integrated circuit chip as shown in the top view of FIG. 20. Conventional transceiver designs require closely coupled high-speed integrated circuitry for reduced delay times. The high-speed integrated circuitry generally considerable power dissipation and heat to the packaged system. The integrated device with the wire bonds 244 coming off the VCSEL and integrated receive amplifier can then be mounted onto lead frames 245, which is a low cost packaging technology.

The transmit/receive amplifier circuit embodiment of the present invention has the added benefit of being relatively easy to manufacture. This alternate embodiment of the present invention is implemented using standard VCSEL manufacturing techniques and process sequences as previously described. The AlAs etch stop layer would be deposited on a conventional VCSEL. On top of the etch stop layer an additional intrinsic i-type layer is deposited, consisting of an absorbing GaAs material. The p-doping extends through the AlAs etch stop layer into the i-type region to avoid heterostructural barriers and band problems. Finally, an n-type layer of $Al_{0.25}Ga_{0.75}As$ is formed on top of the intrinsic layer with a thin GaAs cap.

Next, the transistor, source 236, gate 237 and drain 238 and n-type contacts 209 for the photodetector 211 are deposited preferably by electron beam evaporation. In this alternate embodiment, the source 236 and drain 238 contacts are the same n-type contact that was used for the photodetector 209. Next selective etching to expose the VCSEL and form the integrated photodetector preamplifier mesa would be performed. The p-type contacts 213, 214 and 215 would then be deposited, preferably by electron beam evaporation, followed by a proton implantation for the transistor 233 and 234, photodetector guard ring 216 and VCSEL 217. As previously described, dielectric layers are next deposited. Dielectric material is deposited on the transistor to decrease degradation and increase the operating life of the device. Silicon nitride is the preferred dielectric material. Next vias are etched into the dielectric layers to allow the interconnect metal 220, 221, 222 and 223 to be deposited. Finally, an anti-reflective coating 225 is applied to the photodetector 211.

It should be noted that a number of variations to the inventions described above will be apparent to those skilled in the art. For example, the p-i-n photodiode can be deposited directly on a semiconductor substrate along with the proton implant guard ring to create a high performance photodetector. In this alternate embodiment the device capacitance can be matched exactly with the mask design and the reverse bias to achieve complete depletion of the i-type region as is required for high-speed performance. In addition, the above photodetector can be integrated with the FET to form a high-speed integrated detector preamplifier. The VCSEL could include a power monitoring photodetector, wherein the monitoring photodetector may be below the VCSEL or on the side or in another location within the package to provide controlled monitoring and feedback.

Those of skill in the art will recognize that the exact order in which the process steps take place, as well as the particular material system used, are irrelevant to the patentability of the present invention. For example, one material system might include a GaAs substrate GaAs quantum wells, DBR layers of AlAs and AlGaAs, and an intrinsic layer of GaAs. The p and n layers of the p-i-n would also be made of AlGaAs. Other known material systems may be used to produce different wavelengths of emitted radiation and the particular dimensions of the integrated devices may be changed to suit particular transmission modes or packaging requirements. Moreover, although it is desirable that the photolithographically defined spacings between the transmit and receive pairs are preferably small, of course larger spacings can be easily accommodated by the present invention.

The invention claimed is:

1. A method of manufacturing a monolithic optical transmitter and receiver pair, comprising:
   forming an optical transmitter on a semiconductor substrate;
   forming an optical receiver on said substrate, said optical receiver being less than 250 microns from the optical transmitter; and
   creating a proton implant region to serve as an isolation region between the optical transmitter and the optical receiver, said isolation region electrically isolating said optical transmitter from said optical receiver wherein said optical transmitter and optical receiver are capable of independent operation.

2. The method of claim 1, wherein the step of forming an optical transmitter comprises:
   forming a first mirror on the semiconductor substrate;
   forming a first cladding layer on the first mirror;
   forming an active region on the first cladding layer;
   forming a second cladding layer on the active region; and
   forming a second mirror layer on the second cladding layer.

3. The method of claim 2, wherein the step of forming an optical receiver comprises:
   forming a p-type layer on at least a portion of the optical transmitter layers;
   forming an intrinsic layer on the p-type layer; and
   forming an n-type layer on the intrinsic layer.

4. The method of claim 2, further comprising forming a dielectric phase shifting layer.

5. The method of claim 1, further comprising:
   forming a transistor electrically coupled to the optical receiver for amplifying signals generated by the optical receiver.

6. The method of claim 1, wherein the optical receiver is formed on the semiconductor substrate.

* * * * *